United States Patent
Chang et al.

(10) Patent No.: US 9,960,032 B2
(45) Date of Patent: May 1, 2018

(54) METHODS OF FORMING THIN FILMS AND METHODS OF FABRICATING INTEGRATED CIRCUIT DEVICES USING THE SAME

(71) Applicants: Samsung Electronics Co., Ltd., Suwon-si (KR); ADEKA CORPORATION, Jeollabuk-do (KR)

(72) Inventors: Jae wan Chang, Seoul (KR); Youn soo Kim, Yongin-si (KR); Tsubasa Shiratori, Suwon-si (KR)

(73) Assignees: Samsung Electronics Co., Ltd. (KR); ADEKA CORPORATION, Tokyo (JP)

( * ) Notice: Subject to any disclaimer, the term of this patent is extended or adjusted under 35 U.S.C. 154(b) by 0 days. days.

(21) Appl. No.: 15/182,744

(22) Filed: Jun. 15, 2016

(65) Prior Publication Data

US 2017/0062205 A1 Mar. 2, 2017

(30) Foreign Application Priority Data

Aug. 24, 2015 (KR) .................. 10-2015-0118876

(51) Int. Cl.
*H01L 21/31* (2006.01)
*H01L 21/02* (2006.01)
*H01L 29/66* (2006.01)
*H01L 21/306* (2006.01)

(52) U.S. Cl.
CPC .... *H01L 21/0228* (2013.01); *H01L 21/02189* (2013.01); *H01L 21/02205* (2013.01); *H01L 21/30604* (2013.01); *H01L 21/31* (2013.01); *H01L 29/66795* (2013.01)

(58) Field of Classification Search
CPC ........... H01L 21/0228; H01L 29/66795; H01L 21/02189; H01L 21/31; H01L 21/02205; H01L 21/30604
See application file for complete search history.

(56) References Cited

U.S. PATENT DOCUMENTS

| | | |
|---|---|---|
| 6,203,613 B1 | 3/2001 | Gates et al. |
| 6,348,386 B1 | 2/2002 | Gilmer |
| 6,852,651 B2 | 2/2005 | Shioya et al. |
| 6,930,059 B2 | 8/2005 | Conley, Jr. et al. |
| 7,238,629 B2 | 7/2007 | Shioya et al. |

(Continued)

FOREIGN PATENT DOCUMENTS

| | | |
|---|---|---|
| KR | 10-0243267 | 11/1999 |
| KR | 10-0640638 | 10/2006 |

(Continued)

*Primary Examiner* — Selim Ahmed
(74) *Attorney, Agent, or Firm* — Myers Bigel, P.A.

(57) ABSTRACT

Provided herein are methods of forming thin films. In some embodiments, to form a thin film, a precursor adsorption layer including an organic ligand is formed by supplying a precursor including a metal or silicon central atom, and the organic ligand onto a lower structure. An intermediate result layer is formed by supplying a non-oxidant onto the precursor adsorption layer. In forming the intermediate result layer, the organic ligand included in the precursor adsorption layer is substituted with a substituent. An oxide film including the central atom is formed from the intermediate result layer by supplying an oxidant onto the intermediate result layer.

19 Claims, 27 Drawing Sheets

(56) References Cited

U.S. PATENT DOCUMENTS

| | | |
|---|---|---|
| 7,521,331 B2 | 4/2009 | Park et al. |
| 7,704,867 B2 | 4/2010 | Kim et al. |
| 8,524,618 B2 | 9/2013 | Ahn et al. |
| 8,883,270 B2 | 11/2014 | Shero et al. |
| 2009/0233434 A1* | 9/2009 | Kim .................. C23C 16/30 438/594 |
| 2011/0014770 A1 | 1/2011 | Park et al. |
| 2012/0225548 A1* | 9/2012 | Kang ............ H01L 21/02189 438/597 |
| 2013/0200491 A1* | 8/2013 | Wamura .............. H01L 28/60 257/532 |

FOREIGN PATENT DOCUMENTS

| | | |
|---|---|---|
| KR | 10-0744656 | 7/2007 |
| KR | 10-2007-0106286 | 11/2007 |
| KR | 10-2012-0100397 | 9/2012 |
| KR | 10-1417728 | 7/2014 |

\* cited by examiner

METHODS OF FORMING THIN FILMS AND METHODS OF FABRICATING INTEGRATED CIRCUIT DEVICES USING THE SAME

CROSS-REFERENCE TO RELATED APPLICATION

This application claims the benefit of and priority to Korean Patent Application No. 10-2015-0118876, filed on Aug. 24, 2015, in the Korean Intellectual Property Office, the disclosure of which is incorporated herein in its entirety by reference.

FIELD

The present inventive concepts relate generally to methods of forming thin films and methods of fabricating integrated circuit devices using the same. The present inventive concepts further relate to methods of forming thin films using a precursor including a central atom and a ligand along with methods of fabricating integrated circuit devices using the same.

BACKGROUND

Along with producing more highly integrated and finer electronic devices, patterns included in the electronic devices have increasingly larger aspect ratios. Deposition techniques that can provide excellent filling properties and excellent step coverage even in a narrow deep space having a large aspect ratio may be desirable. In particular, in performing an atomic layer deposition (ALD) process for forming a thin film on a deep narrow 3-dimensional structure, it may be desirable to develop techniques of forming a thin film having desired properties.

SUMMARY

The present inventive concepts provide a method of forming a thin film having desired properties without supplying an excess of an oxidant in order to facilitate removal of a ligand, even from the bottom of a 3-dimensional structure, when the thin film is formed on a deep narrow 3-dimensional structure using a precursor including a central atom and the ligand.

The present inventive concepts also provide a method of fabricating an integrated circuit device, which includes a process of forming a thin film having desired properties without supplying an excess of an oxidant in order to facilitate removal of a ligand, even from the bottom of a deep narrow 3-dimensional structure, when the thin film is formed on a deep narrow 3-dimensional structure using a precursor including a central atom and the ligand.

According to an aspect of the present inventive concepts, there is provided a method of forming a thin film. The method of forming a thin film includes: forming a precursor adsorption layer including an organic ligand by supplying a precursor and the organic ligand onto a lower structure, wherein the precursor includes a metal or silicon central atom; forming an intermediate result layer, in which the organic ligand included in the precursor adsorption layer is substituted with a substituent, by supplying a non-oxidant onto the precursor adsorption layer; and forming an oxide film, which includes the central atom, from the intermediate result layer by supplying an oxidant onto the intermediate result layer.

In some example embodiments, the non-oxidant may include a nitrogen-containing material and the substituent may be amidogen (—NH$_2$).

In some example embodiments, the precursor may include an amido ligand.

In some other example embodiments, the precursor may include a first ligand including an amido group, and at least one second ligand selected from a C1 to C5 aliphatic organic ligand and a C4 to C20 aromatic organic ligand.

In some example embodiments, the precursor may be represented by the following formula:

wherein M is the central atom;
N is a nitrogen atom;
$R^1$ and $R^2$ are each independently a C1 to C5 alkyl group;
$R^3$ is one selected from $NR^1R^2$, a C1 to C5 aliphatic organic ligand, and a substituted or unsubstituted C4 to C20 aromatic organic ligand;
m and n are each independently an integer of 0 or more; and
m+n is an integer of 2 to 8.

In some example embodiments, $R^3$ may be an unsubstituted C4 to C20 aromatic organic ligand. In some example embodiments, $R^3$ may be a C1 to C4 linear or branched alkyl group-substituted C4 to C20 aromatic organic ligand.

In some example embodiments, the central atom may be zirconium (Zr), lithium (Li), beryllium (Be), boron (B), sodium (Na), magnesium (Mg), aluminum (Al), potassium (K), calcium (Ca), scandium (Sc), titanium (Ti), vanadium (V), chromium (Cr), manganese (Mn), iron (Fe), cobalt (Co), nickel (Ni), copper (Cu), zinc (Zn), gallium (Ga), germanium (Ge), rubidium (Rb), strontium (Sr), yttrium (Y), niobium (Nb), molybdenum (Mo), technetium (Tc), ruthenium (Ru), rhodium (Rh), palladium (Pd), silver (Ag), cadmium (Cd), indium (In), tin (Sn), antimony (Sb), cesium (Cs), barium (Ba), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), hafnium (Hf), tantalum (Ta), tungsten (W), rhenium (Re), osmium (Os), iridium (Ir), platinum (Pt), gold (Au), mercury (Hg), lead (Pb), bismuth (Bi), polonium (Po), radium (Ra), actinium (Ac), or silicon (Si).

In some example embodiments, the non-oxidant may be $NH_3$, $NH_2A^1$, or $NHA^1A^2$, wherein $A^1$ and $A^2$ are the same or different and are each independently a C1 to C5 linear or branched alkyl group or a substituted or unsubstituted C4 to C20 aromatic group.

In some example embodiments, the precursor may be (cyclopentadienyl)tris(dimethylamino)zirconium and the non-oxidant may be $NH_3$.

In some example embodiments, the oxidant may include $O_3$, $H_2O$, $O_2$, $NO_2$, NO, $N_2O$, $H_2O$, alcohol, a metal alkoxide, plasma $O_2$, remote plasma $O_2$, plasma $N_2O$, and/or plasma $H_2O$.

In some example embodiments, the method of forming a thin film may further include: performing a first purge for removing by-products and unreacted materials remaining on the precursor adsorption layer after the forming of the precursor adsorption layer; performing a second purge for removing by-products and unreacted materials remaining on the intermediate result layer after the forming of the intermediate result layer; and performing a third purge for removing by-products and unreacted materials remaining on the oxide layer after the forming of the oxide layer.

In some example embodiments, the precursor may include zirconium (Zr) and an amido ligand, the non-oxidant may include a nitrogen-containing material, and the oxide film may include $ZrO_2$.

In some example embodiments, the lower structure may include an electrode layer, and the oxide film may be a dielectric film formed on the electrode layer.

In some example embodiments, the lower structure may include a fin-type active region including a semiconductor, and the oxide film may be a dielectric film covering an upper surface and sidewalls of the fin-type active region.

According to another aspect of the present inventive concepts, there is provided a method of fabricating an integrated circuit device. The method of fabricating an integrated circuit device includes: forming a lower structure having a step height on a substrate; and forming an oxide film on the lower structure. In some example embodiments, to form the oxide film, a precursor adsorption layer, which includes metal or silicon central atoms and organic ligands bonded to the central atoms, is formed on an upper surface and sidewalls of the lower structure. In some example embodiments, at least a portion of the organic ligands is substituted with a substituent by supplying a non-oxidant onto the precursor adsorption layer. In some example embodiments, the oxide film including the central atoms is formed by supplying an oxidant onto the precursor adsorption layer.

In some example embodiments, in forming the precursor adsorption layer in the method of fabricating an integrated circuit device, the organic ligands may include an amido ligand and, in substituting at least the portion of the organic ligands with the substituent, the non-oxidant may be a nitrogen-containing material.

In some example embodiments, in the method of fabricating an integrated circuit device, the forming of the precursor adsorption layer may include supplying a precursor onto the lower structure, wherein the precursor is represented by the following formula:

$$M(NR^1R^2)_m R^3_n$$

wherein M, N, $R^1$, $R^2$, $R^3$, m, and n are each defined as described above.

In some example embodiments, in the method of fabricating an integrated circuit device, in the substituting of at least the portion of the organic ligands with the substituent, the non-oxidant may be $NH_3$, $NH_2A^1$, or $NHA^1A^2$, wherein $A^1$ and $A^2$ are the same or different and are each independently a C1 to C5 linear or branched alkyl group or a substituted or unsubstituted C4 to C20 aromatic group.

In some example embodiments, in the method of fabricating an integrated circuit device, the forming of the precursor adsorption layer may include supplying a precursor including zirconium (Zr) and an amido ligand onto the lower structure, the substituting of at least the portion of the organic ligands with the substituent may include supplying the non-oxidant including a nitrogen-containing material onto the precursor adsorption layer, and the forming of the oxide film may include forming a $ZrO_2$ film on an upper surface and sidewalls of the lower structure.

In some example embodiments, in the method of fabricating an integrated circuit device, the forming of the lower structure may include: forming a mold pattern on the substrate, the mold pattern including a hole exposing a conductive region of a substrate; forming an electrode having a sidewall extending along an inner wall of the hole; and exposing the sidewall of the electrode by removing the mold pattern to provide an exposed surface including the sidewall of the electrode, and the forming of the oxide film may include forming a $ZrO_2$ film covering an exposed surface including the sidewall of the electrode.

In some example embodiments, in the method of fabricating an integrated circuit device, the forming of the lower structure may include forming a fin-type active region protruding upwards from the substrate by etching a portion of the substrate, and the forming of the oxide film may include forming a $ZrO_2$ film covering the fin-type active region.

According to a method of forming a thin film in accordance with the present inventive concepts, when a deposition process is performed to form a thin film, such as, e.g., in a deep narrow 3-dimensional space, a non-oxidant, which allows a specific ligand (e.g., an amido ligand) in a precursor to be selectively substituted, is introduced as a reactive gas, whereby an amount of a supplied oxidant used as a reactant in the deposition process can be reduced. Thus, problems which might occur in a lower structure, such as, e.g., a lower electrode of a capacitor, due to use of an excess of the oxidant, for example, problems, such as oxidation of the lower electrode due to use of an excess of the oxidant when a dielectric film is formed on the lower electrode of the capacitor, occurrence of a bridge between neighboring lower electrodes since deformation of the lower electrode is derived due to the oxidation of the lower electrode, and the like, can be suppressed. In addition, ligands can be effectively removed from precursors used as a raw material in the deposition process, and the formation of a thin film having desired properties can be facilitated, thereby providing a reliable integrated circuit device. In some embodiments, a method of the present invention may reduce impurities in a thin film, such as, e.g., a dielectric film. In some embodiments, in a method of the present invention the oxidant may reduce an oxygen vacancy in a thin film and/or may improve the properties of the thin film. In some embodiments, a method of the present invention may improve or reduce a defect of a bridge between neighboring storage nodes by minimizing oxidation of the storage nodes.

Provide according to some embodiments of the present inventive concepts, method of forming a thin film, the method including supplying a precursor and the organic ligand onto a lower structure to form a precursor adsorption layer, wherein the precursor comprises a metal or silicon central atom; supplying a non-oxidant onto the precursor adsorption layer to form an intermediate result layer, wherein supplying the non-oxidant onto the precursor adsorption layer comprises substituting the organic ligand of the precursor adsorption layer with a substituent; and supplying an oxidant onto the intermediate result layer to form the thin film, the thin film comprising the central atom from the precursor adsorption layer.

In some embodiments, the non-oxidant includes a nitrogen-containing material and the substituent is amidogen ($-NH_2$).

In some embodiments, the precursor includes an amido ligand. In some embodiments, the precursor includes a first ligand comprising an amido ligand, and at least one second ligand selected from a C1 to C5 aliphatic organic ligand and a C4 to C20 aromatic organic ligand. In some embodiments, the precursor is represented by the following formula:

$$M(NR^1R^2)_m R^3_n,$$

wherein M is the central atom;
N is a nitrogen atom;
$R^1$ and $R^2$ are each independently a C1 to C5 alkyl group;

$R^3$ is one selected from $NR^1R^2$, a C1 to C5 aliphatic organic ligand, and a substituted or unsubstituted C4 to C20 aromatic organic ligand;

m and n are each independently an integer of 0 or more; and m+n is an integer of 2 to 8.

In some embodiments, $R^3$ is an unsubstituted C4 to C20 aromatic organic ligand. In some embodiments, $R^3$ is a substituted C4 to C20 aromatic organic ligand that is substituted with at least one C1 to C4 linear or branched alkyl group.

In some embodiments, the central atom is zirconium (Zr), lithium (Li), beryllium (Be), boron (B), sodium (Na), magnesium (Mg), aluminum (Al), potassium (K), calcium (Ca), scandium (Sc), titanium (Ti), vanadium (V), chromium (Cr), manganese (Mn), iron (Fe), cobalt (Co), nickel (Ni), copper (Cu), zinc (Zn), gallium (Ga), germanium (Ge), rubidium (Rb), strontium (Sr), yttrium (Y), niobium (Nb), molybdenum (Mo), technetium (Tc), ruthenium (Ru), rhodium (Rh), palladium (Pd), silver (Ag), cadmium (Cd), indium (In), tin (Sn), antimony (Sb), cesium (Cs), barium (Ba), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), hafnium (Hf), tantalum (Ta), tungsten (W), rhenium (Re), osmium (Os), iridium (Ir), platinum (Pt), gold (Au), mercury (Hg), lead (Pb), bismuth (Bi), polonium (Po), radium (Ra), actinium (Ac), or silicon (Si).

In some embodiments, the non-oxidant is $NH_3$, $NH_2A^1$, or $NHA^1A^2$, wherein $A^1$ and $A^2$ are the same or different and are each independently a C1 to C5 linear or branched alkyl group or a substituted or unsubstituted C4 to C20 aromatic group.

In some embodiments, the precursor is (cyclopentadienyl) tris(dimethylamino)zirconium and the non-oxidant is $NH_3$.

In some embodiments, the oxidant comprises $O_3$, $H_2O$, $O_2$, $NO_2$, $NO$, $N_2O$, $H_2O$, alcohol, a metal alkoxide, plasma $O_2$, remote plasma $O_2$, plasma $N_2O$, or plasma $H_2O$.

In some embodiments, the method further includes performing a first purge after the forming of the precursor adsorption layer; performing a second purge after the forming of the intermediate result layer; and performing a third purge after the forming of the oxide film.

BRIEF DESCRIPTION OF THE DRAWINGS

Example embodiments of the present inventive concepts will be more clearly understood from the following detailed description taken in conjunction with the accompanying drawings.

FIG. 9A is a plan view of an integrated circuit device which is intended to be formed. FIG. 9B is a perspective view of the integrated circuit device of FIG. 9A. FIG. 9C shows sectional views respectively taken along lines X-X' and Y-Y' of FIG. 9A.

DETAILED DESCRIPTION OF EXAMPLE EMBODIMENTS

Figure 1:
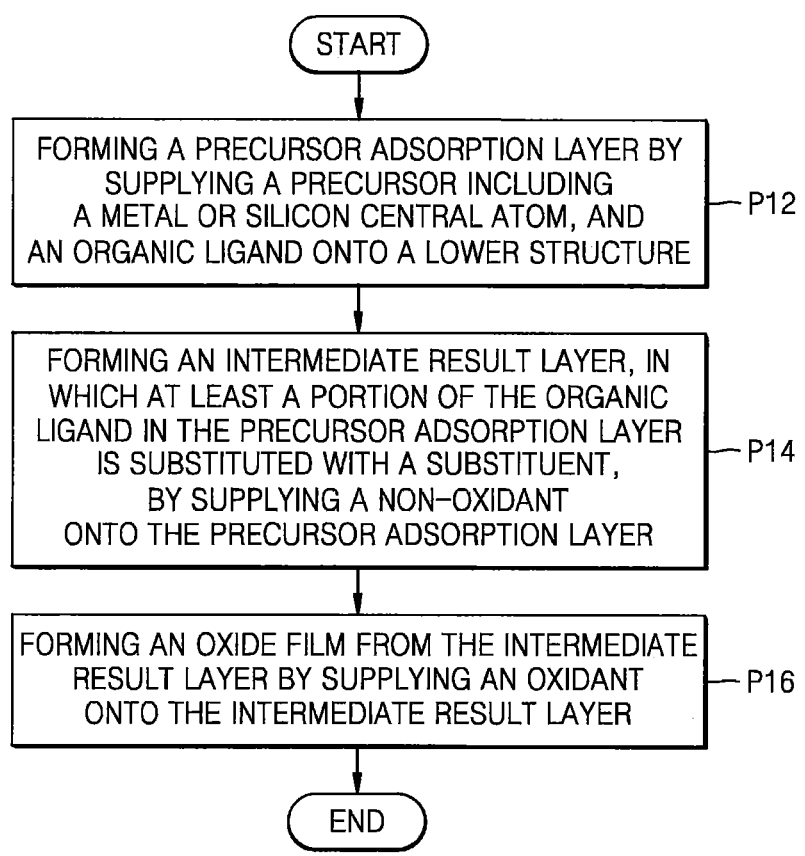
FIG. 1 is a flow chart illustrating a method of forming a thin film according to an example embodiment of the present inventive concepts.

Hereinafter, example embodiments of the inventive concept will be described in detail with reference to the accompanying drawings. Like components will be denoted by like reference numerals throughout the specification, and overlapping descriptions thereof will be omitted.

As used herein, the term "and/or" includes any and all combinations of one or more of the associated listed items. Expressions such as "at least one of," when preceding a list of elements, modify the entire list of elements and do not modify the individual elements of the list.

It should be understood that the embodiments are provided for complete disclosure and thorough understanding of the inventive concept by those of ordinary skill in the art, and that the inventive concept is not limited to the following embodiments and may be embodied in different ways.

It will be also understood that although the terms such as "first", "second" and the like may be used herein to describe various members, regions, layers, portions, and/or components, these members, regions, layers, portions, and/or components should not be limited by these terms. These terms do not imply a specific order, a relative upper or lower location, or relative superiority or inferiority, and are used only to distinguish one member, region, portion, or component from another member, region, portion, or component. Thus, a first member, region, portion, or component, which will be described below, could be termed a second member, region, portion, or component without departing from the teachings of the inventive concept. For example, a first component could be termed a second component without departing from the scope of the inventive concept, and similarly, a second component could also be termed a first component.

Unless otherwise defined, all terms used herein, including technical and scientific terms, have the same meaning as generally understood by those of ordinary skill in the art. It will be understood that terms, such as those defined in generally used dictionaries, should be interpreted as having a meaning that is consistent with meanings understood in the context of the related art, and will not be interpreted in an idealized or overly formal sense unless expressly so defined herein.

In some embodiments, a specific process may be performed in a different order than the described order. For example, two processes successively described may be substantially simultaneously performed, and may also be performed in an opposite order than the described order.

In the accompanying drawings, modifications of illustrated shapes can be anticipated, for example, depending upon fabricating techniques and/or tolerances. Thus, example embodiments of the present inventive concepts are not to be construed as being limited to specific shapes of regions illustrated herein, and are to be construed as including, for example, variations of shapes caused in the process of fabrication. In addition, the term "substrate" as used herein may refer to a substrate itself, or to a stacked structure including a substrate and a certain layer, film, or the like on a surface of the substrate. Further, the term "surface of a substrate" may refer to an exposed surface of a substrate itself, or an outer surface of a certain layer, film, or the like on the substrate. As used herein, the symbol "Me" represents a methyl group, the symbol "Et" represents an ethyl group, the symbol "iPr" represents an isopropyl group, the symbol "tBu" represents a tertiary butyl group, and the symbol "Cp" represents a cyclopentadienyl group.

FIG. 1 is a flow chart illustrating a method of forming a thin film according to an example embodiment of the present inventive concepts.

Figure 2A:
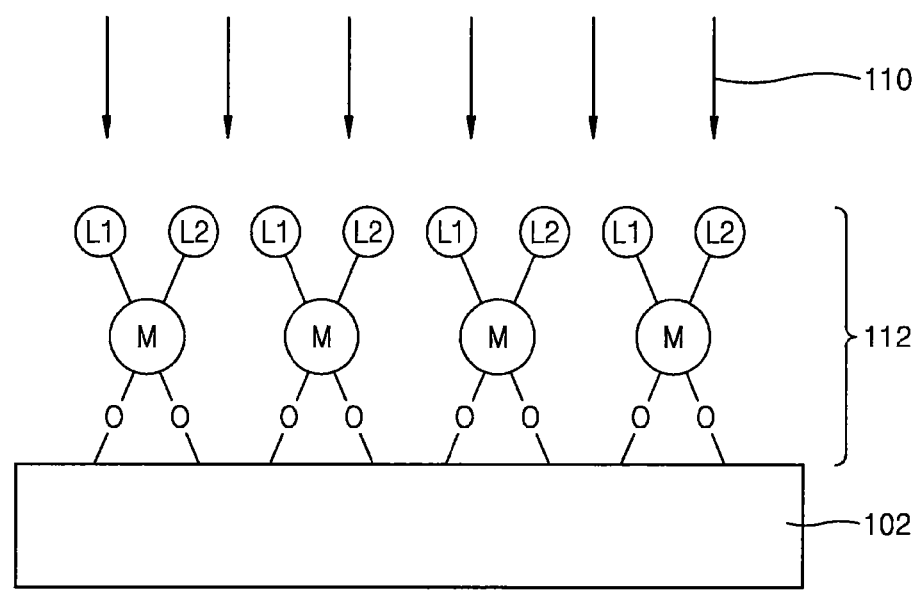
FIGS. 2A to 2C are schematic drawings showing a process of forming one atomic layer when a thin film is formed by a method of forming a thin film according to an example embodiment of the present inventive concepts.
Figure 2B:
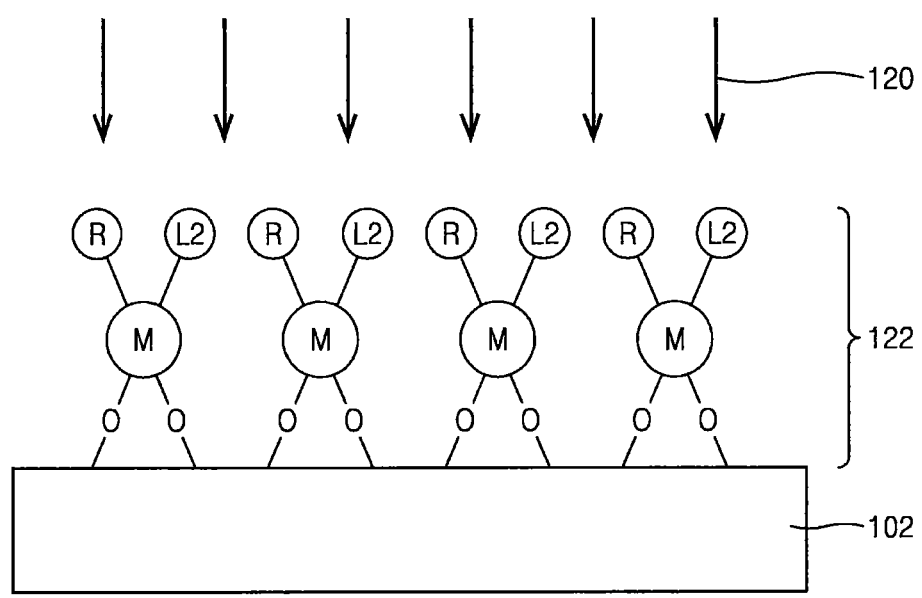
Figure 2C:
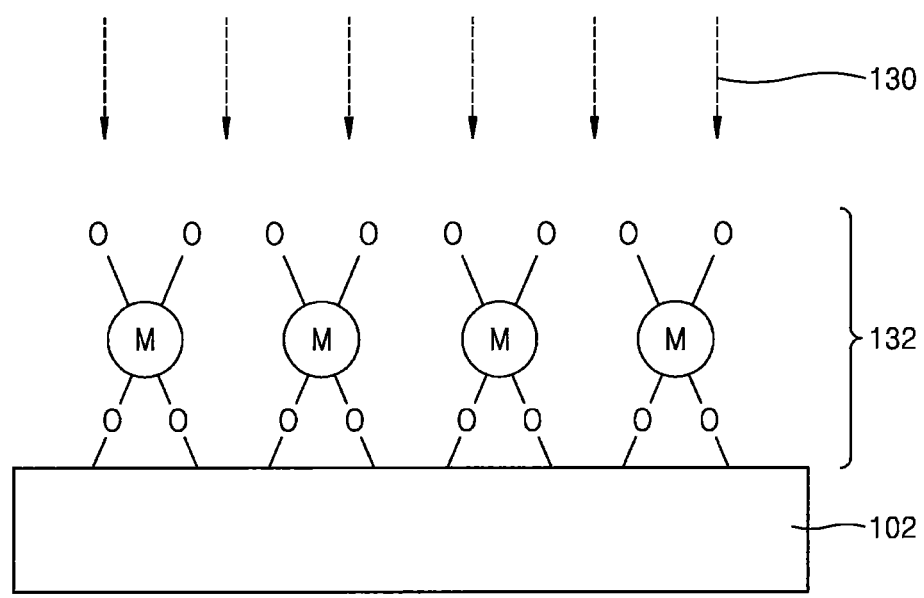

FIGS. 2A to 2C are schematic drawings showing a process of forming one atomic layer when a thin film is formed according to the method shown in FIG. 1.

Referring to FIGS. 1 and 2A, in operation P12, a precursor adsorption layer 112 including organic ligands L1 and L2 is formed on a lower structure 102, such as, for example, a substrate 102, by supplying a precursor 110 including a central atom M, which is a metal or silicon, and the organic ligands L1 and L2.

In some example embodiments, the precursor 110 may include at least one ligand selected from a ligand including an amido group, a C1 to C5 aliphatic organic ligand, and a C4 to C20 aromatic organic ligand.

In some example embodiments, the precursor 110 may be represented by Formula 1.

  [Formula 1]

wherein M is the central atom;
N is a nitrogen atom;
$R^1$ and $R^2$ are each independently a C1 to C5 alkyl group;
$R^3$ is selected from $NR^1R^2$, a C1 to C5 aliphatic organic ligand, and a substituted or unsubstituted C4 to C20 aromatic organic ligand;
m and n are each independently an integer of 0 or more; and
m+n is an integer of 2 to 8.

The functional group, $—NR^1R^2$ is an amido ligand or amido group with $R^1$ and $R^2$ as defined in Formula 1. In the precursor 110, $—NR^1R^2$ is bonded to the central atom M and $R^1$ and $R^2$ are each independently bonded to the nitrogen atom.

In some example embodiments, $R^3$ may be an unsubstituted C4 to C20 aromatic organic ligand. For example, $R^3$ may be a cyclopentadienyl group.

In some example embodiments, $R^3$ may be a C4 to C20 aromatic organic ligand that is substituted with a C1 to C4 linear or branched alkyl group. For example, $R^3$ may include a substituent such as a methyl group, an ethyl group, or a tert-butyl group.

A material used as the central atom M is not particularly limited. For example, the central atom M may be zirconium (Zr), lithium (Li), beryllium (Be), boron (B), sodium (Na), magnesium (Mg), aluminum (Al), potassium (K), calcium (Ca), scandium (Sc), titanium (Ti), vanadium (V), chromium (Cr), manganese (Mn), iron (Fe), cobalt (Co), nickel (Ni), copper (Cu), zinc (Zn), gallium (Ga), germanium (Ge), rubidium (Rb), strontium (Sr), yttrium (Y), niobium (Nb), molybdenum (Mo), technetium (Tc), ruthenium (Ru), rhodium (Rh), palladium (Pd), silver (Ag), cadmium (Cd), indium (In), tin (Sn), antimony (Sb), cesium (Cs), barium (Ba), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), hafnium (Hf), tantalum (Ta), tungsten (W), rhenium (Re), osmium (Os), iridium (Ir), platinum (Pt), gold (Au), mercury (Hg), lead (Pb), bismuth (Bi), polonium (Po), radium (Ra), actinium (Ac), or silicon (Si).

In some example embodiments, the precursor 110 may include zirconium (Zr). For example, the precursor 110 may include, but is not limited to, at least one selected from (cyclopentadienyl)tris(dimethylamino)zirconium (CpZr(NMe$_2$)$_3$), tetrakis-ethylmethylamido-zirconium (TEMAZ), tetrakis-diethylamido-zirconium (TDEAZ), tetrakis-dimethylamido-zirconium (TDMAZ), tetrakis-ethyldimethylamido-zirconium, tetrakis-diethylmethylamido-zirconium, tetrakis-triethylamido-zirconium, tetrakis-triethylamido-zirconium, bis-diisopropylamido-bis-dimethylamido-zirconium, bis-di-t-butylamido-bis-dimethylamido-zirconium, bis-ethylmethylamido-bis-diisopropylamido-zirconium, bis-diethylamido-bis-diisopropylamido-zirconium, tris-diisopropylamido-dimethylamido-zirconium, and tris-diethylamido-diisopropylamido-zirconium.

The lower structure 102 may include a substrate including a semiconductor element, such as, e.g., silicon (Si) and germanium (Ge), or a compound semiconductor, such as, e.g., silicon carbide (SiC), gallium arsenide (GaAs), indium arsenide (InAs), and indium phosphide (InP). In some example embodiments, the lower structure 102 may include a semiconductor substrate and structures including at least one insulating film or at least one conductive region formed on the semiconductor substrate. The at least one conductive region may include an impurity-doped well, an impurity-doped structure, a metal-containing conductive layer, and/or the like. In some example embodiments, the substrate 102 may have various device isolation structures such as, e.g., a shallow trench isolation (STI) structure.

According to some example embodiments, in a method of forming a thin film according to example embodiments of the present inventive concepts, details of compounds capable of being used as the precursor 110, and details of organic coordination compounds capable of being included as a ligand in the precursor 110 will be described below.

In some example embodiments, before the precursor 110 is supplied onto the lower structure 102, a space in which the lower structure 102 is located, for example, an inside of a reaction chamber may be maintained in an $O_2$ or $O_3$ atmosphere. Thus, a site on an exposed surface of the lower structure 102, onto which the central atom M may be adsorbed, may include an oxygen atom, and the central atom M may be adsorbed onto the lower structure 102 through a medium of the oxygen atom, to form the precursor adsorption layer including the central atom M.

To supply the precursor 110 onto the lower structure 102, a carrier gas may be used. For example, the carrier gas may include Ar, $N_2$, He, Kr, Xe, or combinations thereof, without being limited thereto.

After the precursor adsorption layer 112 as shown in FIG. 2A is formed according to operation P12 of FIG. 1, a first purge process for removing by-products and/or unreacted materials remaining on the precursor adsorption layer 112 may be performed. To perform the first purge process, a purge gas may be supplied onto the lower structure 102, thereby removing unnecessary by-products and/or unreacted materials on the precursor adsorption layer 112. For example, the purge gas may include an inert gas, such as Ar, He, and Ne, $N_2$ gas, and/or the like.

Referring to FIGS. 1 and 2B, in operation P14, an intermediate result layer 122, in which at least a portion of the organic ligands L1 and L2 included in the precursor adsorption layer 112 is substituted with a substituent R, is formed by supplying a non-oxidant 120 onto the precursor adsorption layer 112 (see FIG. 2A).

As used herein, the term "non-oxidant" may refer to a material that does not oxidize the precursor adsorption layer 112.

Although the intermediate result layer 122, in which only a portion of the organic ligands L1 and L2 included in the precursor adsorption layer 112 are substituted with the substituent R, is illustrated in FIG. 2B, the present inventive concepts is not limited to the example shown in FIG. 2B. For example, in some example embodiments, all of the organic ligands L1 and L2 included in the precursor adsorption layer 112 may be substituted with the substituent R.

In some example embodiments, the non-oxidant 120 may not include an oxygen atom. In some example embodiments, the non-oxidant 120 may include a nitrogen-containing material. For example, the substituent R may be amidogen ($-NH_2$).

In some example embodiments, the non-oxidant 120 may be $NH_3$, $NH_2A^1$, or $NHA^1A^2$, wherein, $A^1$ and $A^2$ may be the same or different and may each independently be a C1 to C5 linear or branched alkyl group or a substituted or unsubstituted C4 to C20 aromatic group. In some example embodiments, at least one of $A^1$ and $A^2$ included in the non-oxidant 120 may be a substituted C4 to C20 aromatic group, and, in some example embodiments, the substituted C4 to C20 aromatic group may have a methyl, ethyl, isopropyl, or t-butyl group as a substituent.

For example, the non-oxidant 120 may include organic amine compounds, such as monoalkylamine, dialkylamine, trialkylamine, alkylenediamine, hydrazine, ammonia, and the like, without being limited thereto.

After the intermediate result layer 122 as shown in FIG. 2B is formed according to operation P14, a second purge process for removing by-products and/or unreacted materials remaining on the intermediate result layer 122 may be performed. To perform the second purge process, a purge gas may be supplied onto the lower structure 102, thereby removing unnecessary by-products and/or unreacted materials on the intermediate result layer 122. For example, the purge gas may include an inert gas, such as Ar, He, Ne, $N_2$, or the like.

Referring to FIGS. 1 and 2C, in operation P16, an oxidant 130 is supplied onto the intermediate result layer 122 (see FIG. 2B), thereby removing residual ligands from the intermediate result layer 122, and thereby forming an oxide film 132 that includes an atomic layer including the central atom M.

In some example embodiments, the oxidant 130 may include $O_3$, $H_2O$, $O_2$, $NO_2$, NO, $N_2O$, $H_2O$, an alcohol, a metal alkoxide, plasma $O_2$, remote plasma $O_2$, plasma $N_2O$, and/or plasma $H_2O$.

The oxidant 130 may have a greater reactivity than the non-oxidant 120 described with reference to FIG. 2B. By supplying the oxidant 130 onto the intermediate result layer 122, the substituent R and the unsubstituted ligand L2 (see FIG. 2B) on the intermediate result layer 122 may be removed, and the central atoms M may be uniformly oxidized. In some embodiments, the non-oxidant may remove the ligand in the precursor, and the oxidant may indiscriminately react with ligands and may remove residual ligands that may not be removed by the non-oxidant.

After the oxide film 132 as shown in FIG. 2C is formed according to operation P16 of FIG. 1, a third purge process for removing by-products and/or unreacted materials remaining on the oxide film 132 may be performed. To perform the third purge process, a purge gas may be supplied onto the lower structure 102, thereby removing unnecessary by-products and/or unreacted materials on the oxide film 132. For example, the purge gas may include an inert gas, such as Ar, He, Ne, $N_2$, and/or the like.

While operations P12, P14, and P16 of FIG. 1 are performed, a space in which the lower structure 102 is located, for example, a reaction chamber for performing an ALD process, may have an atmosphere temperature of about 100° C. or more, for example, about 150° C. to about 500° C., without being limited thereto.

When the oxide film 132 is formed by the method of forming a thin film according to an example embodiment of the present inventive concepts as shown in FIG. 1 using an ALD process, to control the thickness of the oxide film 132, the number of ALD cycles may be adjusted. Operations P12 to P16 may be repeatedly performed until the oxide film 132 has a desired thickness on the lower structure 102.

When the oxide film 132 is formed by the method of forming a thin film according to an example embodiment of the present inventive concepts as shown in FIG. 1 using an ALD process, energy, such as plasma, light, voltage, and/or the like, may be applied. A time point of applying such energy may be variously selected. For example, energy, such as plasma, light, voltage, and/or the like, may be applied when the precursor 110 (see FIG. 2A) is introduced into a reaction chamber for an ALD process according to operation P12 of FIG. 1, when the precursor 110 is adsorbed onto the lower structure 102, when an exhaustion process by a purge gas is performed, when the non-oxidant 120 (see FIG. 2B) is introduced into the reaction chamber according to operation P14 of FIG. 1, when the oxidant 130 is introduced into the reaction chamber according to operation P16 of FIG. 1, and/or between these time points.

The precursor 110 that can be used in a method of forming a thin film according to example embodiments of the present inventive concepts is not limited to the examples set forth above. For example, the precursor 110 that can be used in operation P12 of FIG. 1 may include a compound of at least one organic coordination compound, which may be selected from an alcohol compound, a glycol compound, a β-diketone compound, a cyclopentadiene compound, and an organic amine compound, and one selected from silicon and a metal.

For example, an organic amine compound, which may be used as the organic coordination compound of the precursor 110 used in operation P12 of FIG. 1, may include methylamine, ethylamine, propylamine, isopropylamine, dimethylamine, diethylamine, dipropylamine, diisopropylamine, ethylmethylamine, propylmethylamine, isopropylmethylamine, and the like, without being limited thereto.

For example, an alcohol compound, which may be used as the organic coordination compound of the precursor 110 used in operation P12 of FIG. 1, may include alkyl alcohols such as methanol, ethanol, propanol, isopropyl alcohol, butanol, sec-butyl alcohol, isobutyl alcohol, tert-butyl alcohol, pentyl alcohol, isopentyl alcohol, tert-pentyl alcohol, and the like; ether alcohols such as 2-methoxyethanol, 2-ethoxyethanol, 2-butoxyethanol, 2-(2-methoxyethoxy) ethanol, 2-methoxy-1-methylethanol, 2-methoxy-1,1-dimethylethanol, 2-ethoxy-1,1-dimethylethanol, 2-propoxy-1,1-diethylethanol, 2-butoxy-1,1-diethylethanol, 2-(2-methoxyethoxy)-1,1-dimethylethanol, 2-propoxy-1,1-diethylethanol, 2-s-butoxy-1,1-diethylethanol, 3-methoxy-1,1-dimethylpropanol, and the like; and dialkylaminoalcohols, without being limited thereto.

For example, a glycol compound, which may be used as the organic coordination compound of the precursor 110 used in operation P12 of FIG. 1, may include 1,2-ethanediol, 1,2-propanediol, 1,3-propanediol, 2,4-hexanediol, 2,2-dimethyl-1,3-propanediol, 2,2-diethyl-1,3-propanediol, 1,3-butanediol, 2,4-butanediol, 2,2-diethyl-1,3-butanediol, 2-ethyl-2-butyl-1,3-propanediol, 2,4-pentanediol, 2-methyl-1,3-propanediol, 2-methyl-2,4-pentanediol, 2,4-hexanediol, and 2,4-dimethyl-2,4-pentanediol, without being limited thereto.

For example, a β-diketone compound, which may be used as the organic coordination compound of the precursor 110 used in operation P12 of FIG. 1, may include alkyl-substituted β-ketones such as acetylacetone, hexane-2,4-dione, 5-methylhexane-2,4-dione, heptane-2,4-dione, 2-methylheptane-3,5-dione, 5-methylheptane-2,4-dione, 6-methylheptane-2,4-dione, 2,2-dimethylheptane-3,5-dione, 2,6-dimethylheptane-3,5-dione, 2,2,6-trimethylheptane-3,5-dione, 2,2,6,6-tetramethylheptane-3,5-dione, octane-2,4-dione, 2,2,6-trimethyloctane-3,5-dione, 2,6-dimethyloctane-3,5-dione, 2,9-dimethylnonane-4,6-dione, 2-methyl-6-ethyldecane-3,5-dione, 2,2-dimethyl-6-ethyldecane-3,5-dione, and the like; fluorine-substituted alkyl β-ketones such as 1,1,1-trifluoropentane-2,4-dione, 1,1,1-trifluoro-5,5-dimethylhexane-2,4-dione, 1,1,1,5,5,5-hexafluoropentane-2,4-dione, 1,3-diperfluorohexylpropane-1,3-dione, and the like; and ether-substituted β-ketones such as 1,1,5,5-tetramethyl-1-methoxyhexane-2,4-dione, 2,2,6,6-tetramethyl-1-methoxyheptane-3,5-dione, 2,2,6,6-tetramethyl-1-(2-methoxyethoxy)heptane-3,5-dione, and the like, without being limited thereto.

For example, a cyclopentadiene compound, which may be used as the organic coordination compound of the precursor 110 used in operation P12 of FIG. 1, may include cyclopentadiene, methylcyclopentadiene, ethylcyclopentadiene, propylcyclopentadiene, isopropylcyclopentadiene, butylcyclopentadiene, sec-butylcyclopentadiene, isobutylcyclopentadiene, tert-butylcyclepentadiene, dimethylcyclopentadiene, tetramethylcyclopentadiene, and the like, without being limited thereto.

A method of forming a thin film according to an example embodiment of the present inventive concepts may provide a desired thin film, such as metals, oxide ceramics, nitride ceramics, glass, and/or the like, by appropriately selecting precursors of different components, reactive gases, and/or thin film formation conditions. For example, a thin film formed by a method of forming a thin film according to an example embodiment of the present inventive concepts may include a Zr oxide film, a Ti oxide film, an Al oxide films, a Hf oxide film, a La oxide film, a Si oxide film, a Ta oxide film, a Nb oxide film, or combinations thereof. A thin film formed by a method of forming a thin film according to an example embodiment of the present inventive concepts may include a composite oxide thin film including at least two central atoms selected from Zr, Ti, Al, Hf, La, Si, Ta, and Nb.

A thin film formed by a method of forming a thin film according to an example embodiment of the present inventive concepts may be used for various purposes. For example, a thin film formed by a method of forming a thin film according to an example embodiment of the present inventive concepts may be used for dielectric films included in capacitors of semiconductor memory devices, gate dielectric films of transistors, conductive barrier films used for wiring, resistive films, magnetic films, barrier metal films for liquid crystals, members for thin film solar cells, members for semiconductor equipment, nanostructures, hydrogen storage alloys, microelectromechanical systems (MEMS) actuators, and/or the like, without being limited thereto.

Figure 3:
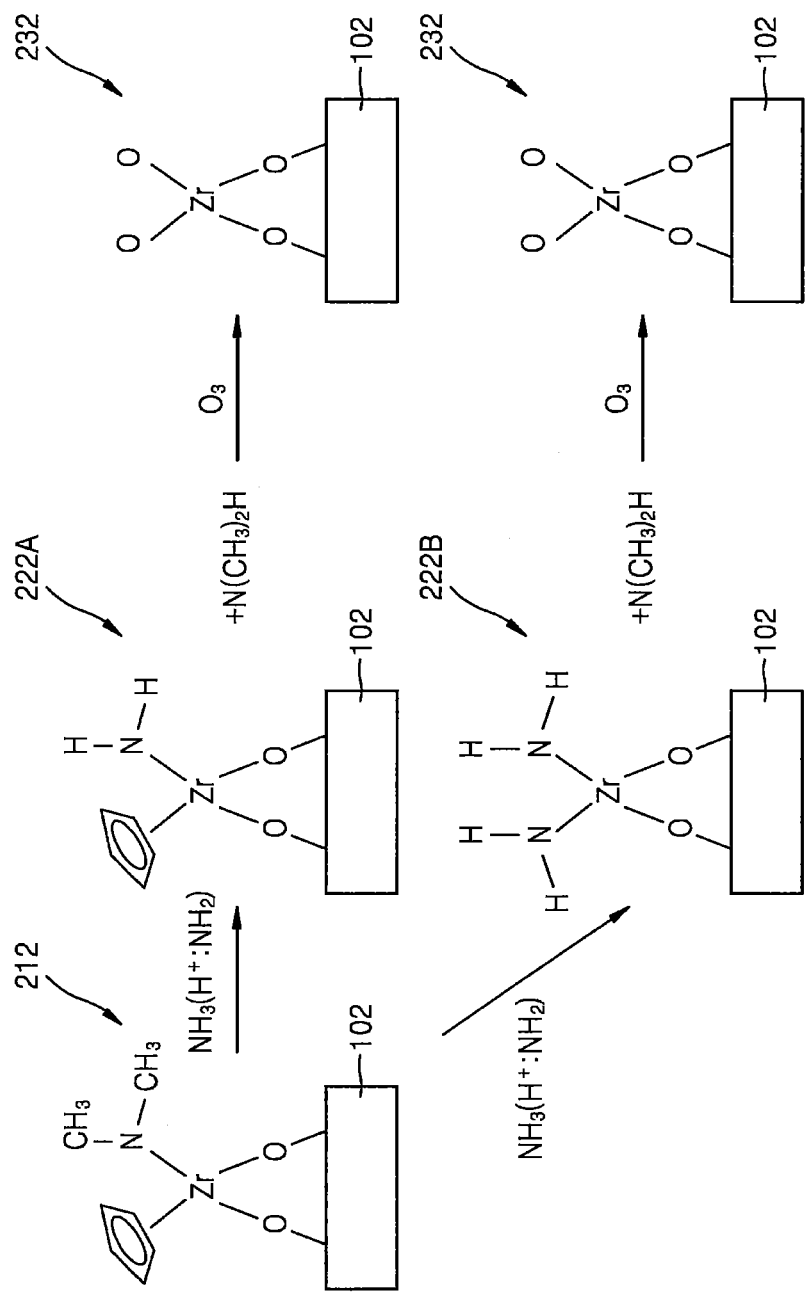
FIG. 3 is a mimetic drawing showing an example mechanism of forming a Zr oxide film according to a method of forming a thin film in accordance with an example embodiment of the present inventive concepts.

FIG. 3 is a mimetic drawing showing an example mechanism of forming a Zr oxide film according to a method of forming a thin film in accordance with an example embodiment of the present inventive concepts. FIG. 3 shows an example in which $CpZr(NMe_2)_3$ is used as a Zr precursor, $NH_3$ is used as a non-oxidant, and $O_3$ is used as an oxidant.

As shown in FIG. 3, when a $ZrO_2$ thin film 232 is formed on a lower structure 102 by an ALD process using a $CpZr(NMe_2)_3$ precursor, a precursor adsorption layer 212 is formed by supplying the $CpZr(NMe_2)_3$ precursor onto the lower structure 102, followed by supplying a non-oxidant $NH_3$ to the precursor adsorption layer 212, thereby obtaining a first intermediate result 222A, in which only a portion of the organic ligands in the precursor adsorption layer 212, for example, only a portion of the dimethyl amine ligands are substituted with amidogen ($NH_2$) through reaction with $NH_3$ corresponding to the non-oxidant, and/or a second intermediate result 222B, in which all of the organic ligands are substituted with amidogen ($NH_2$).

Next, ligands in the first intermediate result 222A and/or the second intermediate result 222B, for example, a cyclopentadienyl ligand, a dimethyl amine ligand, and/or amidogen ($NH_2$) may be removed through reaction with $O_3$ corresponding to the oxidant, thereby forming the Zr oxide film 232.

In the process of forming the Zr oxide film 232 as shown in FIG. 3, after the precursor adsorption layer 212 is formed by supplying the $CpZr(NMe_2)_3$ precursor onto the lower structure 102, and before $O_3$ (corresponding to the oxidant) is supplied onto the first intermediate result 222A and/or second intermediate result 222B, a process of supplying $NH_3$ (corresponding to the non-oxidant) onto the precursor adsorption layer 212 is added, which may allow for ligands to be easily removed, even when a small amount of the oxidant is used. As such, since an amount of the oxidant for removing the ligands in the process of forming a thin film may be reduced as compared with that used in the art, the provided oxidant can remain even after sufficiently removing the ligands. In this case, the oxidant remaining after use thereof can contribute to reducing an impurity and/or an oxygen vacancy in a thin film obtained by a method of forming a thin film according to an example embodiment of the present inventive concepts, for example, in the Zr oxide film. Thus, a high-quality thin film, in which an impurity and/or an oxygen vacancy are reduced, may be formed.

Although an example in which a Zr oxide film is formed has been described with reference to FIG. 3, the present inventive concepts are not limited to the example shown in FIG. 3, and a method of forming a thin film according to the present inventive concepts can be applied to processes of forming a thin film using any precursor having a structure in which a central atom is bonded to an organic ligand.

Hereinafter, evaluation of examples of thin films obtained by a method of forming a thin film according to an example embodiment of the present inventive concepts will be described in detail.

Figure 4A:
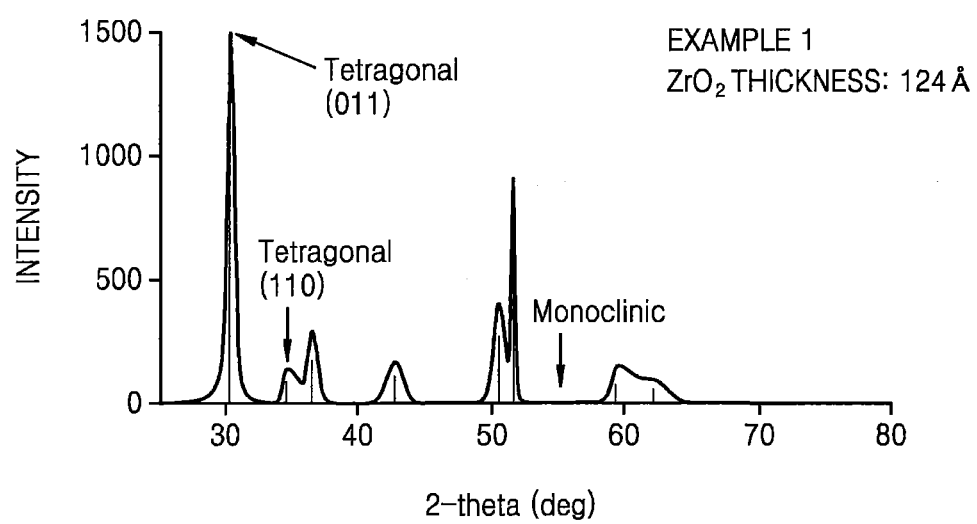
FIGS. 4A and 4B are graphs depicting X-ray diffraction (XRD) intensities of a $ZrO_2$ thin film obtained by methods of forming thin films according to an example embodiment of the present inventive concepts and a comparative example, respectively.

FIG. 4A is a graph depicting X-ray diffraction (XRD) intensities of a $ZrO_2$ thin film obtained by a method of forming a thin film according to an example embodiment of the present inventive concepts.

For an evaluation of FIG. 4A, a $ZrO_2$ thin film was formed on a TiN film corresponding to a lower structure according to the method described with reference to FIG. 1. Here, $CpZr(NMe_2)_3$ was used as a Zr precursor, and $NH_3$ (corresponding to a non-oxidant) and $O_3$ (corresponding to an oxidant) were used as reaction gases.

Figure 4B:
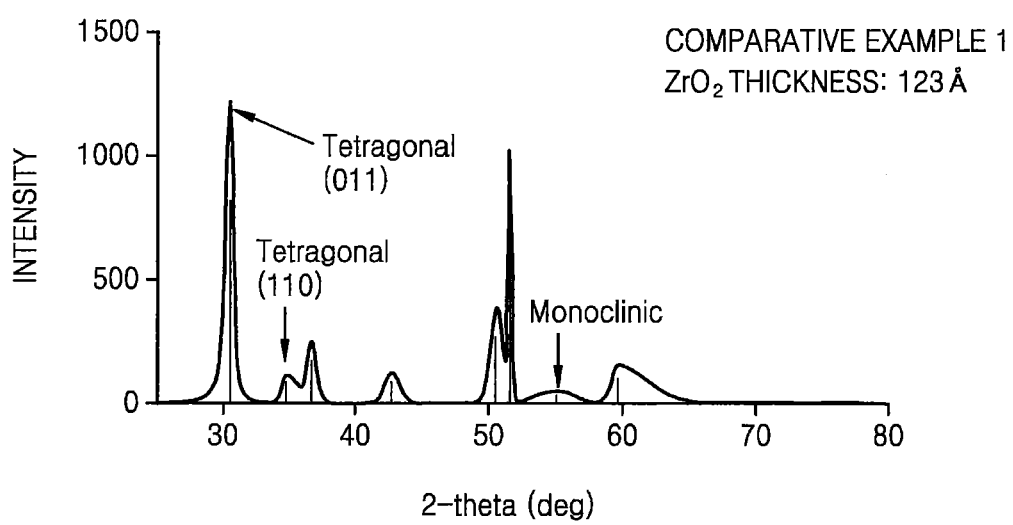

FIG. 4B shows, as a comparative example, a graph depicting XRD intensities of a $ZrO_2$ thin film (Comparative Example 1) obtained only using $O_3$ (corresponding to an oxidant) as a reaction gas.

Generally, a $ZrO_2$ thin film formed on a TiN film may have a tetragonal phase. However, when a $ZrO_2$ thin film is formed by a general method, if a thickness of the $ZrO_2$ thin film is relatively increased, as stress due to the TiN film corresponding to a lower structure is released, a monoclinic phase, which is thermodynamically stable in a bulk state, starts to be grown (see Comparative Example 1 of FIG. 4B). The monoclinic phase included in the $ZrO_2$ thin film can have an adverse influence on a dielectric constant of the $ZrO_2$ thin film.

On the other hand, when the $ZrO_2$ thin film was obtained by a method of forming a thin film according to an example embodiment of the present inventive concepts using $NH_3$ (corresponding to a non-oxidant) and $O_3$ (corresponding to an oxidant) as reaction gases, it could be confirmed that the monoclinic phase was suppressed, and that an intensity of a tetragonal (011) peak, as in Example 1 shown in FIG. 4A, was increased by about 20% as compared with that in FIG. 4B.

As can be seen from FIGS. 4A and 4B, in the $ZrO_2$ thin film (Example 1) obtained by a method of forming a thin film according to an example embodiment of the present inventive concepts (FIG. 4A), a portion having a tetragonal phase was increased, and a portion having a monoclinic phase, which has an adverse influence on a dielectric constant of the $ZrO_2$ thin film, was reduced, as compared with the $ZrO_2$ thin film which had a similar thickness to the $ZrO_2$ thin film of Example 1 and was obtained by a method according to Comparative Example 1 (FIG. 4B).

Figure 5:
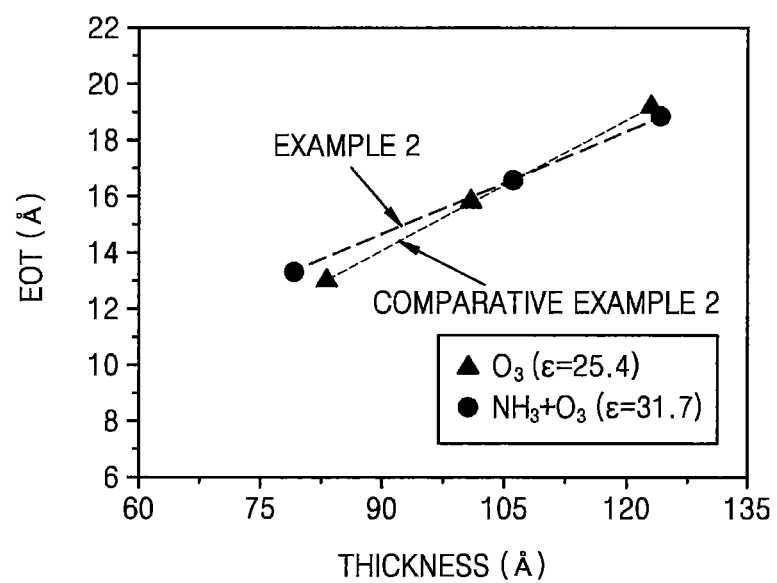
FIG. 5 is a graph depicting evaluation results of an equivalent oxide thickness (EOT) depending upon thicknesses of a $ZrO_2$ thin film obtained by a method of forming a thin film according to an example embodiment of the present inventive concepts.

FIG. 5 is a graph depicting evaluation results of an equivalent oxide thickness (EOT) depending upon thicknesses of a $ZrO_2$ thin film obtained by a method of forming a thin film according to an example embodiment of the present inventive concepts.

For an evaluation of FIG. 5, $ZrO_2$ thin films according to Example 2 and Comparative Example 2 were respectively formed according to the same method as in Example 1 and Comparative Example 1 of FIGS. 4A and 4B, respectively.

As can be seen from the results of FIG. 5, a dielectric constant of each of the $ZrO_2$ thin films could be calculated from a slope of the graph obtained in each of Example 1 and Comparative Example 1. The $ZrO_2$ thin film of Example 2 had a dielectric constant of 31.7, and the $ZrO_2$ thin film of Comparative Example 2 had a dielectric constant of 25.4. As such, it could be confirmed that the $ZrO_2$ thin film of Example 2 had a greater dielectric constant than the $ZrO_2$ thin film of Comparative Example 2.

The results of FIG. 5 are associated with the results obtained from the evaluations of FIGS. 4A and 4B, that is, the results in the $ZrO_2$ thin film of Example 1, in which the portion having a tetragonal phase was increased, and in which the portion having a monoclinic phase that has an adverse influence on the dielectric constant of the $ZrO_2$ thin film was reduced. That is, the $ZrO_2$ thin film obtained according to Example 2 was a thin film obtained using $NH_3$ (corresponding to a non-oxidant) and $O_3$ (corresponding to an oxidant) as the reaction gases, and it could be understood that as the portion having a tetragonal phase was increased and the portion having a monoclinic phase was reduced in the $ZrO_2$ thin film, the $ZrO_2$ thin film obtained according to Example 2 had a greater dielectric constant than that of Comparative Example 2.

Figure 6:
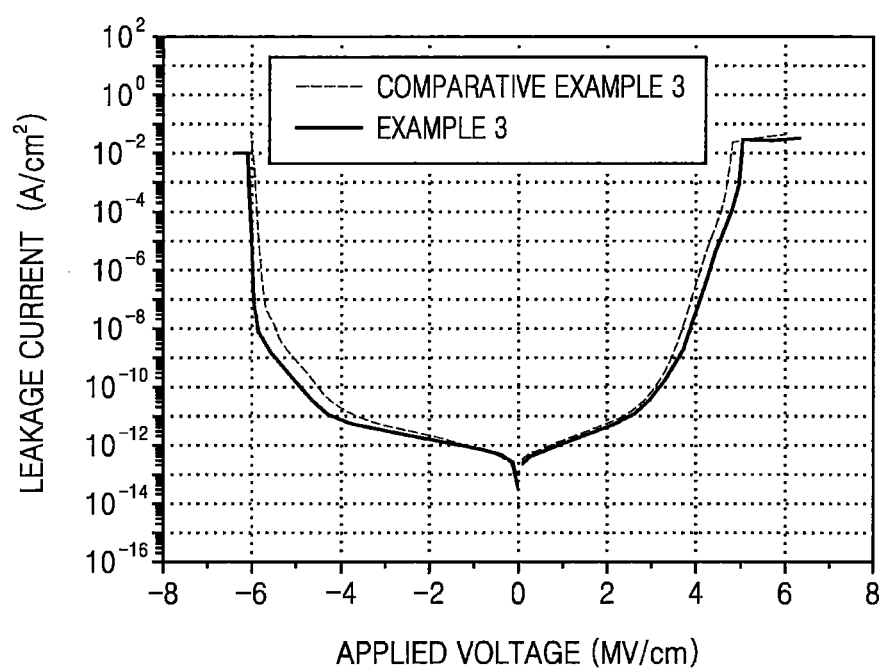
FIG. 6 is a graph depicting evaluation results of electrical properties of a $ZrO_2$ thin film obtained by a method of forming a thin film according to an example embodiment of the present inventive concepts.

FIG. 6 is a graph depicting evaluation results of electrical properties of a $ZrO_2$ thin film obtained by a method of forming a thin film according to an example embodiment of the present inventive concepts.

For an evaluation of FIG. 6, leakage current characteristics of $ZrO_2$ thin films according to Example 3 and Comparative Example 3, which are formed by the same method as in Example 1 and Comparative Example 1 for the evaluations of FIGS. 4A and 4B, respectively, were evaluated.

As can be seen from the results of FIG. 6, the $ZrO_2$ thin film according to Example 3 had a smaller leakage current than the $ZrO_2$ thin film according to Comparative Example 3.

Figure 7A:
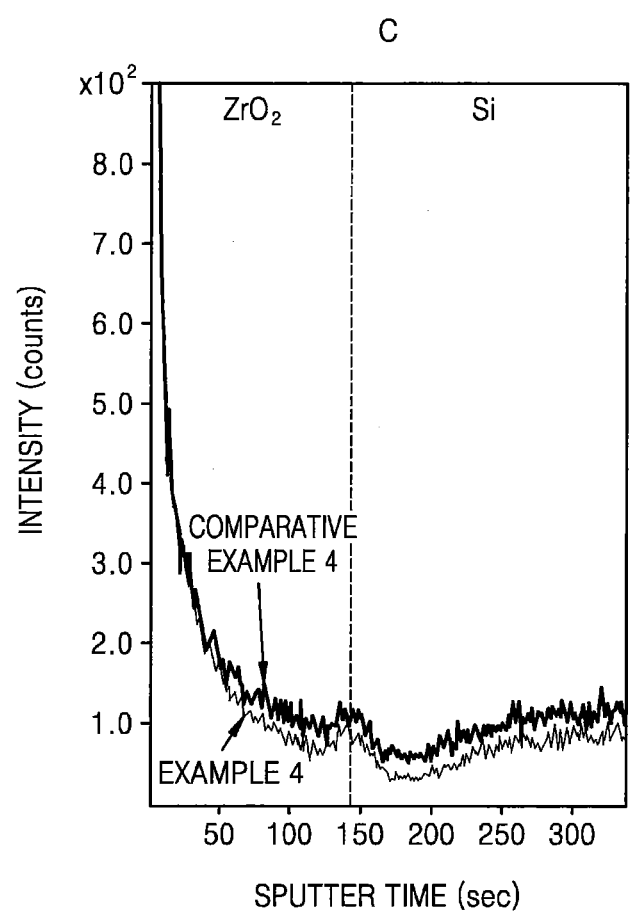
FIGS. 7A and 7B are respective graphs depicting analysis results of an impurity content of a $ZrO_2$ thin film obtained by a method of forming a thin film according to an example embodiment of the present inventive concepts, the results being analyzed using time-of-flight secondary ion mass spectroscopy (TOF-SIMS).
Figure 7B:
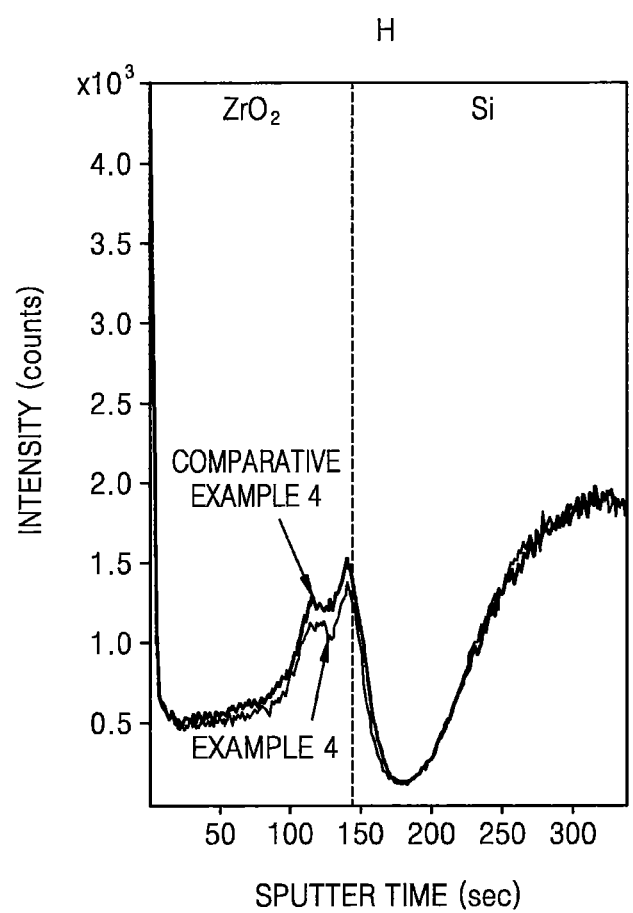

FIGS. 7A and 7B are respective graphs depicting the analysis results of an impurity content of a $ZrO_2$ thin film obtained by a method of forming a thin film according to an example embodiment of the present inventive concepts, the results being analyzed using time-of-flight secondary ion mass spectroscopy (TOF-SIMS).

More specifically, $ZrO_2$ thin films according to Example 4 and Comparative Example 4 were formed on a silicon (Si) substrate according to the same method as in Example 1 and Comparative Example 1 for the evaluations of FIGS. 4A and 4B, respectively, and a carbon (C) content (FIG. 7A) and a hydrogen (H) content (FIG. 7B) for each of the $ZrO_2$ thin films according to Example 4 and Comparative Example 4 were evaluated. Results are shown in FIGS. 7A and 7B.

As can be seen from the results of FIGS. 7A and 7B, since the $ZrO_2$ thin film according to Example 4 included less carbon (C) and hydrogen (H) contents than the $ZrO_2$ thin film according to Comparative Example 4, the $ZrO_2$ thin film according to Example 4 included a less overall impurity content than the $ZrO_2$ thin film according to Comparative Example 4.

FIGS. 8A to 8J are sectional views illustrating a process order for a method of fabricating an integrated circuit device 300 (see FIG. 8J) according to an example embodiment of present the inventive concepts.

Figure 8A:
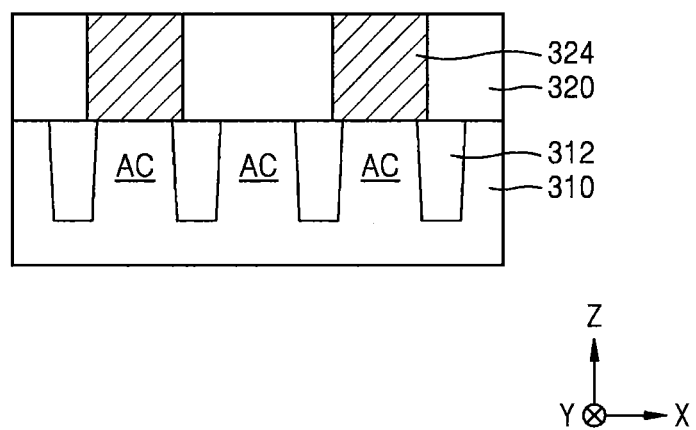
FIGS. 8A to 8J are sectional views illustrated according to a process order for a method of fabricating an integrated circuit device according to an example embodiment of the present inventive concepts.

Referring to FIG. 8A, an interlayer dielectric 320 is formed on a substrate 310 including a plurality of active regions AC, followed by forming a plurality of conductive regions 324 penetrating through interlayer dielectric 320 to be connected to the plurality of active regions AC.

The substrate 310 may include a semiconductor, such as Si or Ge, or a compound semiconductor, such as SiGe, SiC, GaAs, InAs, or InP. In some example embodiments, the substrate 310 may include at least one of a Group III-V material and a Group IV material. The Group III-V material may be a binary, ternary, or quaternary compound including at least one Group III atom and at least one Group V atom. The Group III-V material may be a compound including at least one atom of In, Ga, and Al as a Group III atom and at least one atom of As, P, and Sb as a Group V atom. For example, the Group III-V material may be selected from InP, $In_zGa_{1-z}As$ ($0 \leq z \leq 1$), and $Al_zGa_{1-z}As$ ($0 \leq z \leq 1$). The binary compound may be, for example, one of InP, GaAs, InAs, InSb, and GaSb. The ternary compound may be one of InGaP, InGaAs, AlInAs, InGaSb, GaAsSb, and GaAsP. The Group IV material may be Si or Ge. However, the Group III-V material and the Group III-V material, which may be used for an integrated circuit device according to an example embodiment of the present inventive concepts, are not limited to the examples set forth above. In some example embodiments, the substrate 310 may have a silicon on insulator (SOI) structure. The substrate 310 may include a conductive region, for example, an impurity-doped well, or an impurity-doped structure.

The plurality of active regions AC may be defined by a plurality of device isolation regions 312 formed on the substrate 310. The device isolation regions 312 may include a silicon oxide film, a silicon nitride film, a silicon oxynitride film, or combinations thereof.

The interlayer dielectric 320 may include a silicon oxide film.

The plurality of conductive regions 324 may be connected to one terminal of a switching device (not shown) such as a field effect transistor formed on the substrate 310. The plurality of conductive regions 324 may include polysilicon, a metal, a conductive metal nitride, a metal silicide, or combinations thereof, without being limited thereto.

Figure 8B:
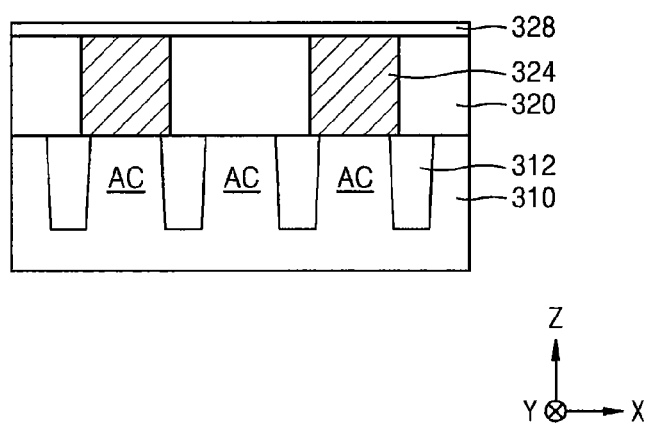

Referring to FIG. 8B, an insulating layer 328 covering the interlayer dielectric 320 and the plurality of conductive regions 324 is formed. The insulating layer 328 may be used as an etch stop layer.

The insulating layer 328 may include an insulating material having an etch selectivity with respect to the interlayer dielectric 320 and a mold film 330 (see FIG. 8C) which is formed in a subsequent process. In some example embodiments, the insulating layer 328 may include silicon nitride, silicon oxynitride, or combinations thereof.

In some example embodiments, the insulating layer 328 may have a thickness in a range of about 100 Å to about 600 Å, without being limited thereto.

Figure 8C:
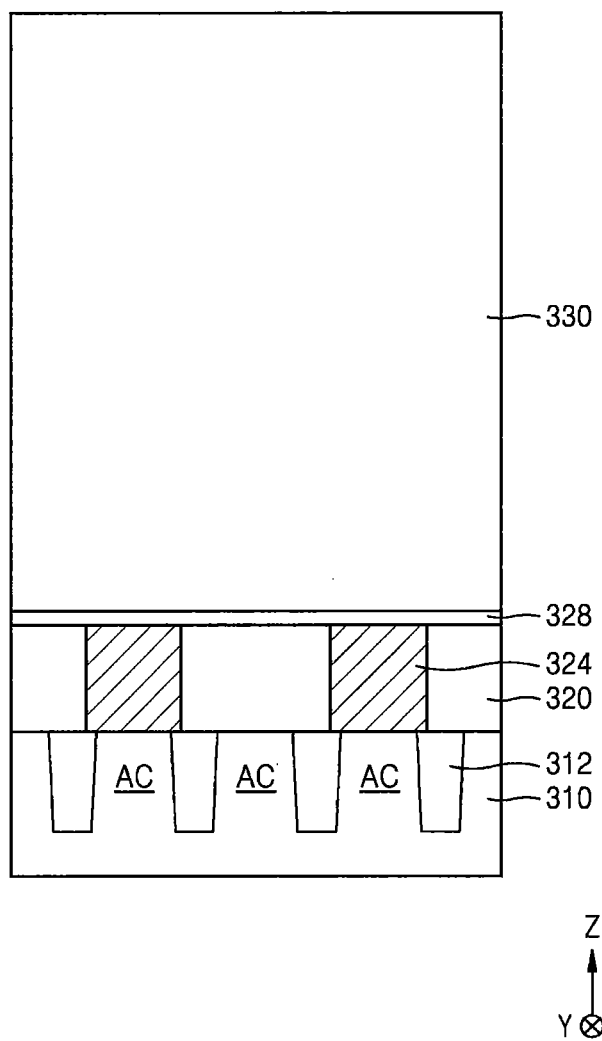

Referring to FIG. 8C, the mold film 330 is formed on the insulating layer 328.

In some example embodiments, the mold film 330 may include an oxide film. For example, the mold film 330 may include an oxide film such as borophosphosilicate glass (BPSG), phosphosilicate glass (PSG), undoped silicate glass (USG), spin on dielectric (SOD), an oxide film formed by a high density plasma chemical vapor deposition (HDP CVD) process, and the like. To form the mold film 330, a thermal CVD process or a plasma CVD process may be used. In some example embodiments, the mold film 330 may have a thickness in a range of about 1000 Å to about 20000 Å, without being limited thereto.

In some example embodiments, the mold film 330 may include a support film (not shown). The support film may be formed of a material having an etch selectivity with respect to the mold film 330, and may have a thickness in a range of about 50 Å to about 3000 Å. The support film may include a material having a relatively low etch rate with respect to an etch atmosphere, for example, with respect to a limulus amoebocyte lysate (LAL) including ammonium fluoride ($NH_4F$), hydrofluoric acid (HF), and water when the mold film 330 is removed by a LAL lift-off process in a subsequent process. In some example embodiments, the support film may include silicon nitride, silicon carbonitride, tantalum oxide, titanium oxide, or combinations thereof, without being limited thereto.

Figure 8D:
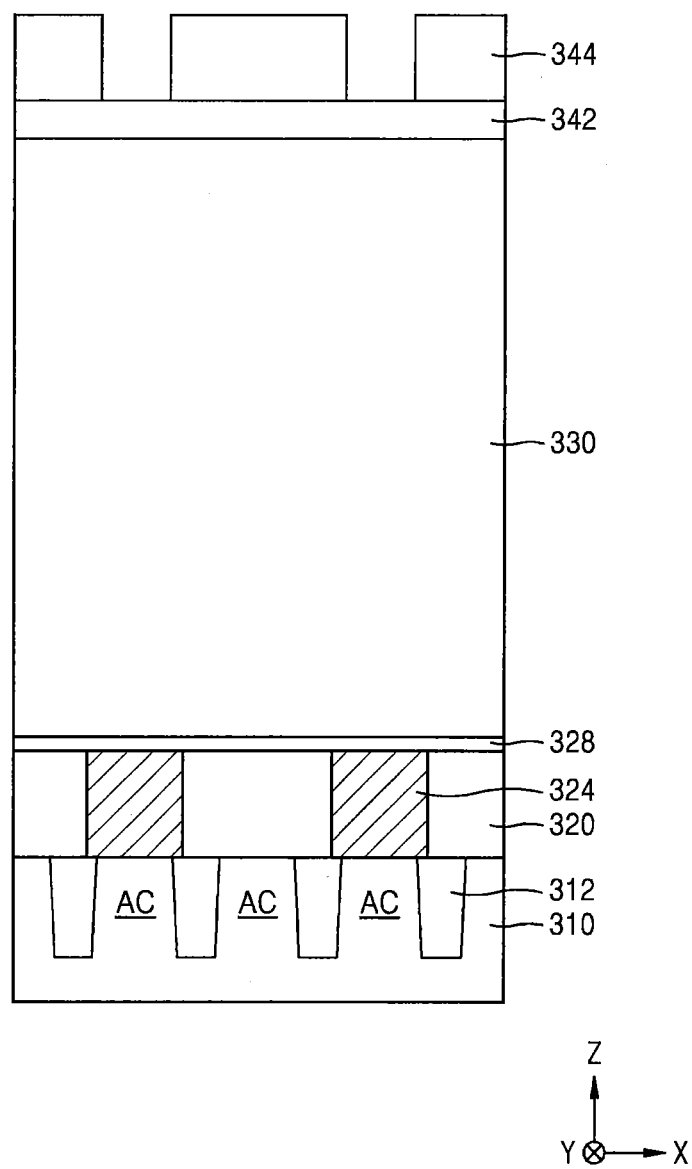

Referring to FIG. 8D, a sacrificial film 342 and a mask pattern 344 are sequentially formed on the mold film 330.

The sacrificial film 342 may include an oxide film such as BPSG, PSG, USG, SOD, an oxide film formed by a HDP CVD process, and the like. The sacrificial film 342 may have a thickness in a range of about 500 Å to about 2000 Å. The sacrificial film 342 may serve to protect the support film, which may be included in the mold film 330.

The mask pattern 344 may include an oxide film, a nitride film, a polysilicon film, a photoresist film, or combinations thereof. A region in which a lower electrode of a capacitor is formed may be defined by the mask pattern 344.

Figure 8E:
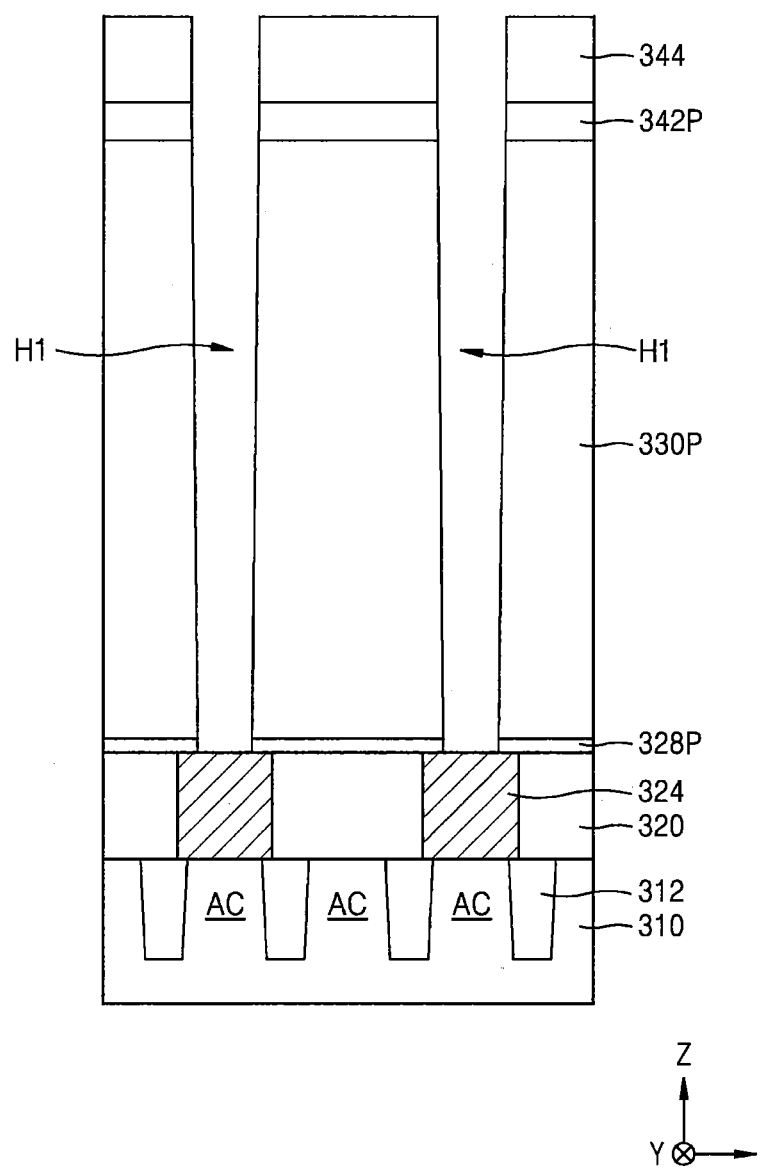

Referring to FIG. 8E, the sacrificial film 342 and the mold film 330 are dry-etched using the mask pattern 344 as an etch mask and using the insulating layer 328 as an etch stop layer, thereby forming a sacrificial pattern 342P and a mold pattern 330P, which define a plurality of holes H1.

Here, the insulating layer 328 may also be etched due to overetch, whereby an insulating pattern 328P exposing the plurality of conductive regions 324 may be formed.

Figure 8F:
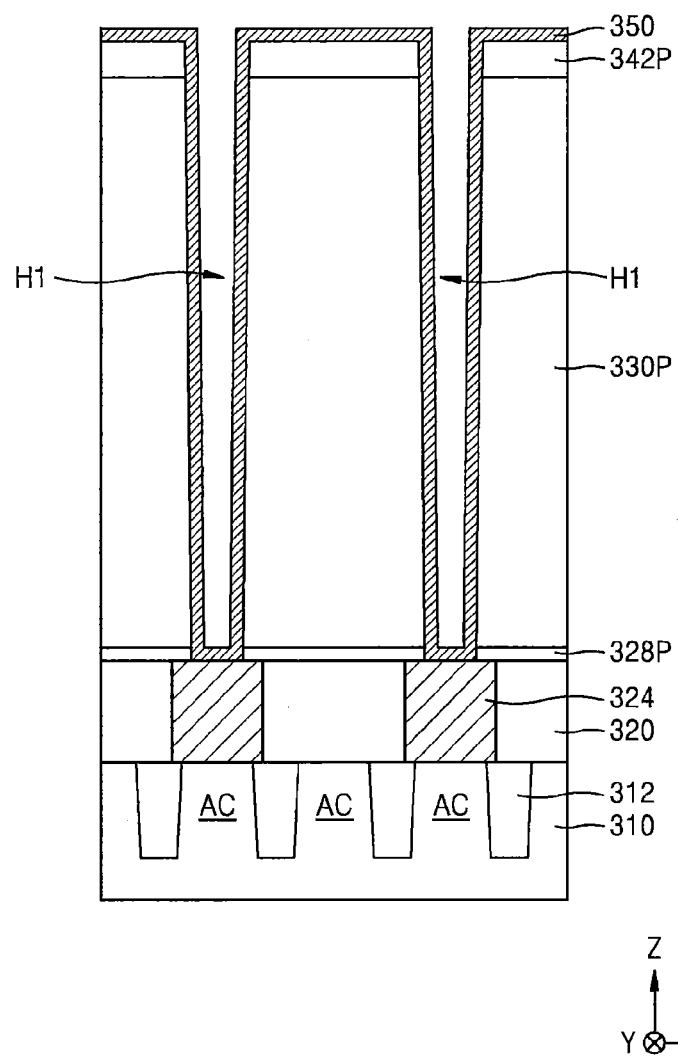

Referring to FIG. 8F, the mask pattern 344 is removed from the resultant of FIG. 8E, followed by forming a conductive film 350 for lower electrode formation, which covers an inner sidewall of each of the plurality of holes H1, an exposed surface of the insulating pattern 328P, an exposed surface of each of the plurality of conductive regions 324 inside the plurality of holes H1, and an exposed surface of the sacrificial pattern 342P.

The conductive film 350 for lower electrode formation may be conformally formed on the sidewalls of the plurality of holes H1 such that an inner space of each of the plurality of holes H1 partially remains.

In some example embodiments, the conductive film 350 for lower electrode formation may include a doped semiconductor, a conductive metal nitride, a metal, a metal silicide, a conductive oxide, or combinations thereof. For example, the conductive film 350 for lower electrode formation may include TiN, TiAlN, TaN, TaAlN, W, WN, Ru, $RuO_2$, $SrRuO_3$, Ir, $IrO_2$, Pt, PtO, SRO ($SrRuO_3$), BSRO (($Ba,Sr)RuO_3$), CRO ($CaRuO_3$), LSCO (($La,Sr)CoO_3$), or combinations thereof, without being limited thereto.

To form the conductive film 350 for lower electrode formation, a CVD, metal organic CVD (MOCVD), or ALD process may be used. The conductive film 350 for lower electrode formation may have a thickness in a range of about 20 nm to about 100 nm, without being limited thereto.

Figure 8G:
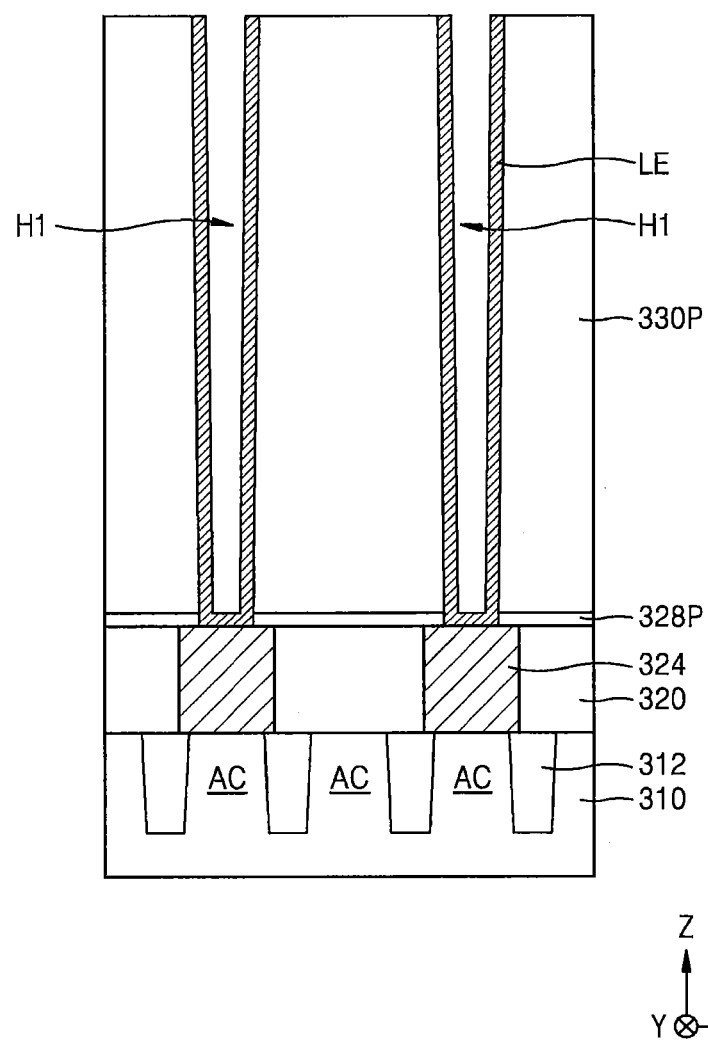

Referring to FIG. 8G, an upper portion of the conductive film 350 for lower electrode formation is partially removed, thereby dividing the conductive film 350 for lower electrode formation into a plurality of lower electrodes LE.

To form the plurality of lower electrodes LE, a portion of the upper portion of the conductive film 350 for lower electrode formation and the sacrificial pattern 342P (see FIG. 8F) may be removed using an etchback or chemical mechanical polishing (CMP) process until an upper surface of the mold pattern 330P is reached.

The plurality of lower electrodes LE may be connected to the conductive regions 324 through the insulating pattern 328P.

Figure 8H:
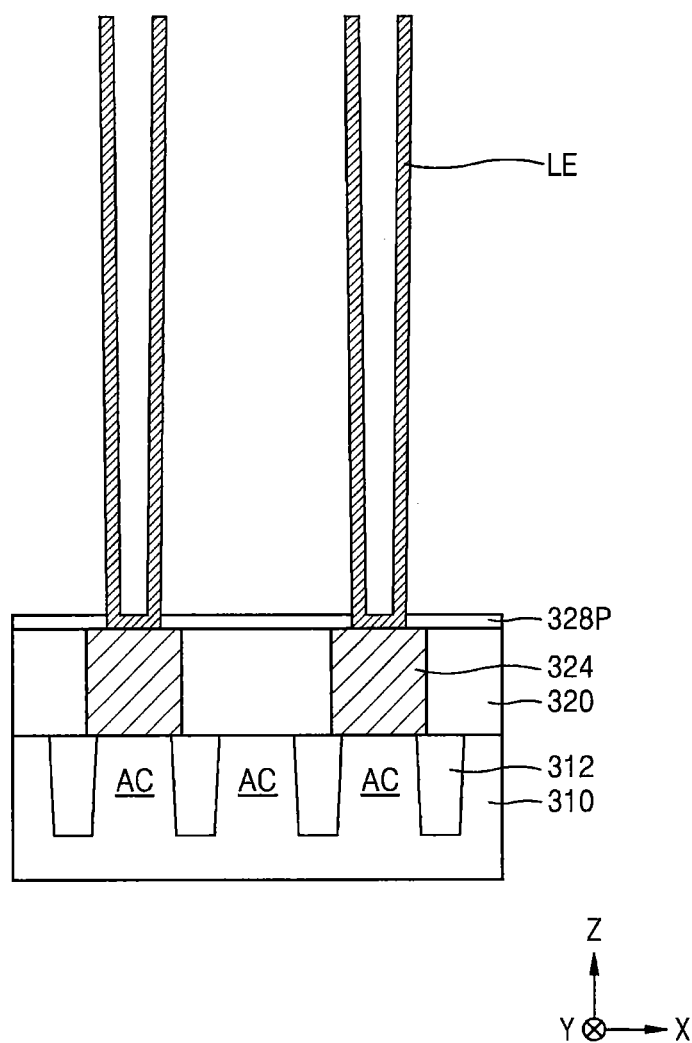

Referring to FIG. 8H, the mold pattern 330P is removed, thereby exposing outer walls of the plurality of lower electrodes LE having a cylinder shape.

The mold pattern 330P may be removed by a lift-off process using LAL or hydrofluoric acid.

Figure 8I:
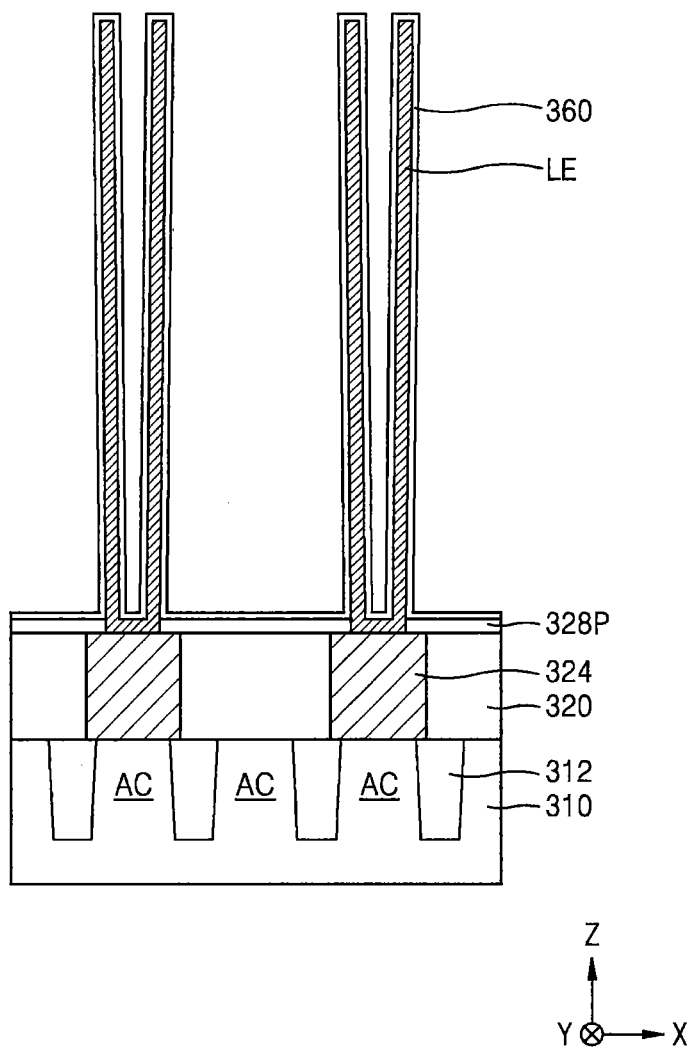

Referring to FIG. 8I, a dielectric film 360 is formed on the plurality of lower electrodes LE.

The dielectric film 360 may be formed to conformally cover exposed surfaces of the plurality of lower electrodes LE.

The dielectric film 360 may be formed by an ALD process. To form the dielectric film 360, a method of forming a thin film according to an example embodiment of the present inventive concepts described herein may be used, such as, e.g., those with reference to FIGS. 1, 2A-2C, and 3.

The dielectric film 360 may include oxide, a metal oxide, nitride, or combinations thereof. In some example embodiments, the dielectric film 360 may include a $ZrO_2$ film. For example, the dielectric film 360 may include a single layer of a $ZrO_2$ film, or may include multiple layers including a combination of at least one $ZrO_2$ film and at least one $Al_2O_3$ film.

In some example embodiments, the dielectric film 360 may have a thickness in a range of about 50 Å to about 150 Å, without being limited thereto.

Figure 8J:
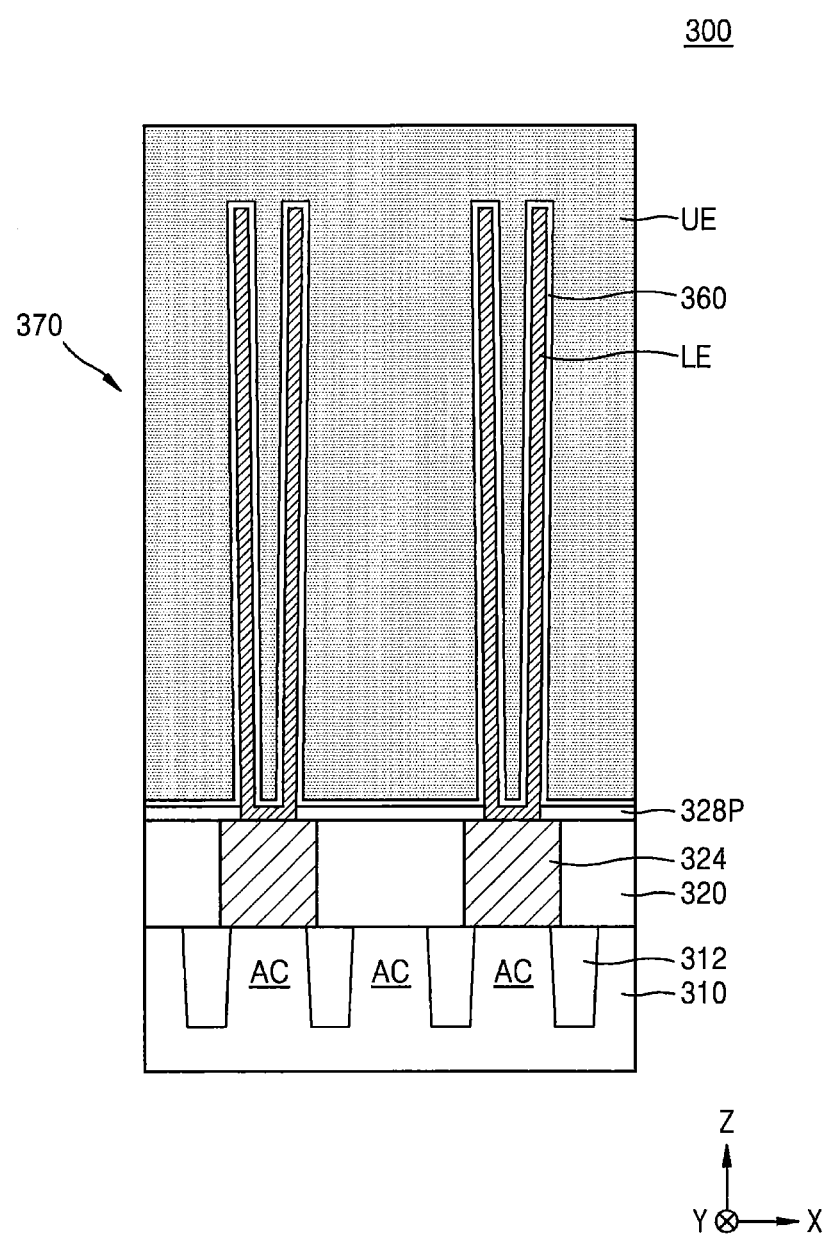

Referring to FIG. 8J, an upper electrode UE is formed on the dielectric film 360.

The lower electrode LE, the dielectric film 360, and the upper electrode UE may constitute a capacitor 370.

The upper electrode UE may include a doped semiconductor, a conductive metal nitride, a metal, a metal silicide, a conductive oxide, or combinations thereof. For example, the upper electrode UE may include TiN, TiAlN, TaN, TaAlN, W, WN, Ru, $RuO_2$, $SrRuO_3$, Ir, $IrO_2$, Pt, PtO, SRO ($SrRuO_3$), BSRO ($(Ba,Sr)RuO_3$), CRO ($CaRuO_3$), LSCO ($(La,Sr)CoO_3$), or combinations thereof, without being limited thereto.

To form the upper electrode UE, a CVD, MOCVD, or ALD process may be used.

Although the method of fabricating the integrated circuit device 300, which includes a process of forming the dielectric film 360 covering a surface of the cylinder type lower electrode LE, has been described with reference to FIGS. 8A to 8J, the present inventive concepts are not limited thereto. For example, a pillar type lower electrode having no inner space may be formed instead of the cylinder type lower electrode LE, and the dielectric film 360 may be formed on the pillar type lower electrode.

According to the method of forming the integrated circuit device 300 in accordance with example embodiments of the present inventive concepts described with reference to FIGS. 8A to 8J, to form the dielectric film 360, the following process is used according to the method of forming a thin film in accordance with an example embodiment of the present inventive concepts. First, a precursor adsorption layer including central atoms and organic ligands bonded to the central atoms is formed on the lower electrode LE, followed by substituting at least a portion of the organic ligands with a substituent using a non-oxidant, thereby forming an intermediate result layer. Next, an oxidant is supplied to the intermediate result layer, thereby forming an oxide film including the central atoms.

In the integrated circuit device 300 fabricated by the method described with reference to FIGS. 8A to 8J, the capacitor 370 includes the lower electrode LE having a 3-dimensional electrode structure in order to increase capacitance. To compensate reduction of capacitance due to reduction of a design rule, an aspect ratio of the lower electrode LE of a 3-dimensional structure is increased. To form a high-quality dielectric film in a deep narrow 3-dimensional space, an ALD process may be used. Generally, when a reaction gas is supplied in performing an ALD process, to sufficiently supply an oxidant up to the bottom of a narrow deep lower electrode of a 3-dimensional structure, a large amount of the oxidant needs to be diffused up to the bottom of the lower electrode of a 3-dimensional structure by increasing an amount of the supplied oxidant such as $O_3$. However, there is a problem in that since the lower electrode is bent due to an increase of oxidation of the lower electrode along with an increasing amount of the oxidant, a bridge between neighboring lower electrodes occurs.

According to the method of fabricating an integrated circuit device in accordance with example embodiments of the present inventive concepts, in forming a dielectric film on a lower electrode of a 3-dimensional structure, a non-oxidant is introduced as a reaction gas in order to substitute at least a portion of the ligands in the precursor adsorption layer with a substituent.

While the non-oxidant selectively substitutes a ligand of an organic metal compound precursor in a precursor adsorption layer, for example, an amido ligand with a substituent, the oxidant can remove a ligand and a substituent through a reaction that is independent of the type of ligand and/or substituent bonded to a central atom. When a non-oxidant and an oxidant are sequentially used according to a method of forming a thin film in accordance with an example embodiment of the present inventive concepts, the non-oxidant can substitute at least a portion of the ligands in a precursor with a substituent, and the substituent, which is relatively easily removed by the oxidant, and residual ligands may be easily removed by a relatively small amount of the oxidant. Thus, according to the method of forming a thin film in accordance with an example embodiment of the present inventive concepts, a non-oxidant is introduced as a reaction gas in a process of forming a thin film using an ALD process, whereby ligands may be effectively removed without use of an excess of an oxidant as compared with a general process of removing ligands using only an oxidant. In addition, since an amount of the oxidant consumed to remove the ligands is reduced, the oxidant remaining after the oxidant may be used to remove the ligands, and may contribute to reducing an oxygen vacancy in the thin film. Therefore, quality and/or properties of the dielectric film 360 of the capacitor 370 may be improved, and problems due to a bridge between the neighboring lower electrodes LE may also be prevented by minimizing oxidation of the lower electrodes LE.

Figure 9A:
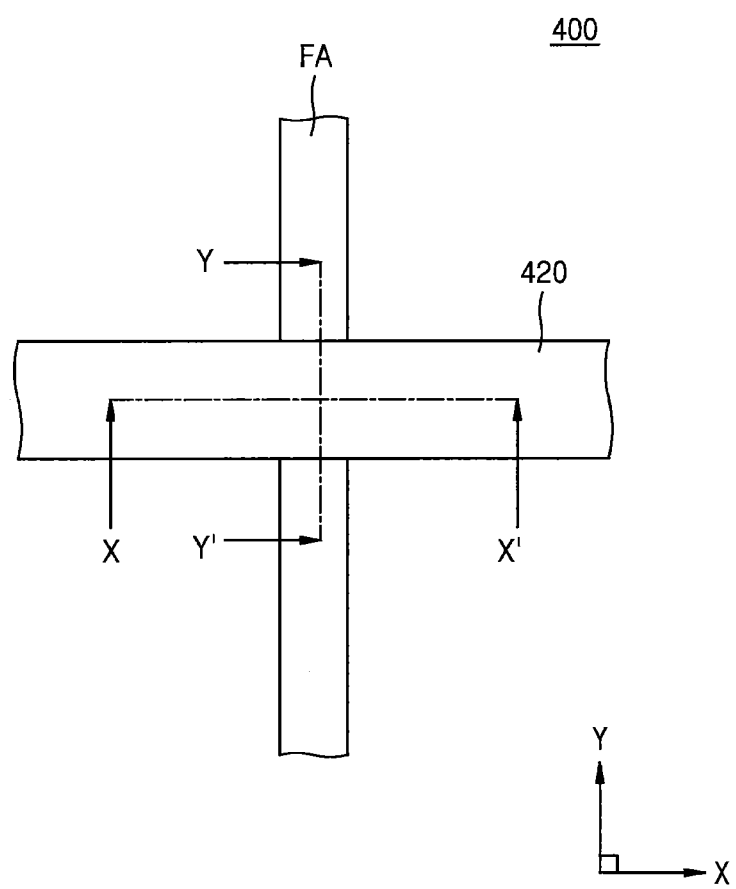
FIGS. 9A to 9C are drawings illustrating a method of fabricating an integrated circuit device according to an example embodiment of the present inventive concepts.
Figure 9B:
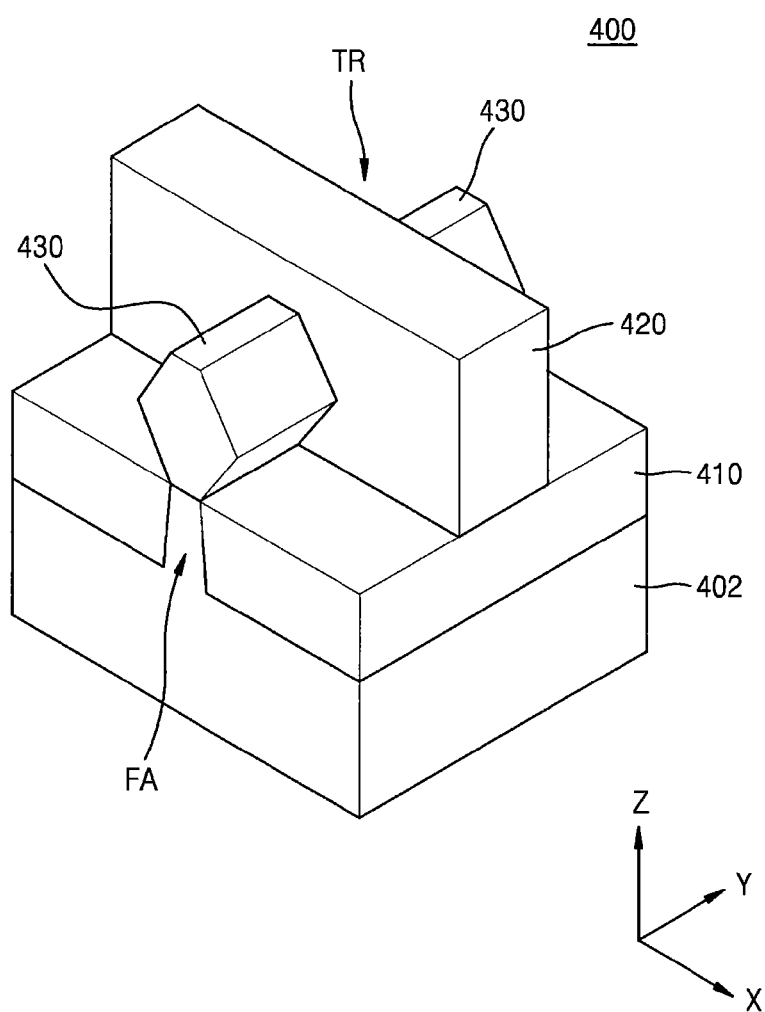
Figure 9C:
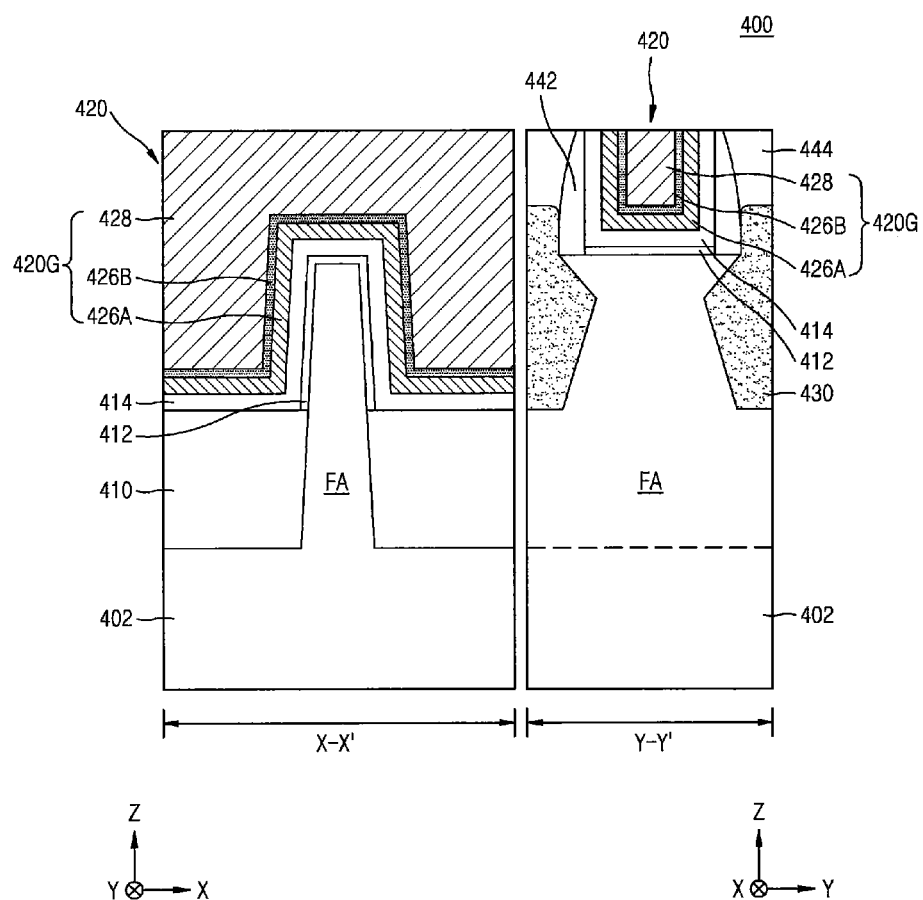

FIGS. 9A to 9C are drawings illustrating a method of fabricating an integrated circuit device according to example embodiments of the present inventive concepts. FIG. 9A is a plan view of an integrated circuit device 400 which is intended to be formed. FIG. 9B is a perspective view of the integrated circuit device 400 of FIG. 9A. FIG. 9C shows sectional views respectively taken along lines X-X' and Y-Y' of FIG. 9A.

Referring to FIGS. 9A to 9C, the integrated circuit device 400 includes a fin-type active region FA protruding from a substrate 402.

Details of the substrate 402 are mostly the same as those described in regard to the substrate 310 with reference to FIG. 8A.

The substrate 402 may include a Group III-V material or a Group IV material, and thus, may be used as a channel material allowing a low-power high-speed transistor to be made. If an MMOS transistor is formed on the substrate 402, the substrate 402 may include one of the Group III-V materials. For example, the substrate 402 may include GaAs. If a PMOS transistor is formed on the substrate 402, the substrate 402 may include a semiconductor material, for example, Ge providing a higher hole mobility than a Si substrate.

The fin-type active region FA may extend along one direction (Y direction in FIGS. 9A and 9B). Referring now to FIG. 9B, a device isolation film 410 covering a lower sidewall of the fin-type active region FA is formed on the substrate 402. The fin-type active region FA protrudes in a fin shape upwards from the device isolation film 410. In some example embodiments, the device isolation film 410 may include a silicon oxide film, a silicon nitride film, a silicon oxynitride film, or combinations thereof, without being limited thereto.

On the fin-type active region FA on the substrate 402, a gate structure 420 may extend in a direction (X direction) intersecting with the direction in which the fin-type active region FA extends. A pair of source/drain regions 430 may be formed at both sides of the gate structure 420 in the fin-type active region FA.

The pair of source/drain regions 430 may include a semiconductor layer epitaxially grown from the fin-type active region FA. Each of the pair of source/drain regions 430 may include an embedded SiGe structure including a plurality of epitaxially grown SiGe layers, an epitaxially grown Si layer, or an epitaxially grown SiC layer. In FIG. 9B, although the pair of source/drain regions 430 are shown as having a specific shape, according to the present inventive concepts, the pair of source/drain regions 430 are not limited to the example of a sectional shape shown in FIG. 9B, and may have various sectional shapes. For example, the pair of source/drain regions 430 may have various sectional shapes such as circles, ellipses, polygons, and the like.

A MOS transistor TR may be formed in a region in which the fin-type active region FA intersects with the gate structure 420. The MOS transistor TR includes a 3-dimensional structured MOS transistor in which channels are formed on an upper surface and both side surfaces of the fin-type active region FA. The MOS transistor TR may constitute an NMOS transistor or a PMOS transistor.

As shown in FIG. 9C, the gate structure 420 may include an interface layer 412, a high-k dielectric film 414, a first metal-containing layer 426A, a second metal-containing layer 426B, and a gap-fill metal layer 428, which are sequentially formed on a surface of the fin-type active region FA. The first metal-containing layer 426A, the second metal-containing layer 426B, and the gap-fill metal layer 428 of the gate structure 420 may constitute a gate electrode 420G.

An insulating spacer 442 may be formed on both side surfaces of the gate structure 420. An interlayer dielectric 444 covering the insulating spacer 442 may be formed at an opposite side to the gate structure 420 with the insulating spacer 442 interposed between the gate structure 420 and the interlayer dielectric 444.

The interface layer 412 may be formed on a surface of the fin-type active region FA. The interface layer 412 may be formed of an insulating material such as an oxide film, a nitride film, or an oxynitride film. The interface layer 412 may constitute a gate insulating film in conjunction with the high-k dielectric film 414.

The high-k dielectric film 414 may include a material having a greater dielectric constant than a silicon oxide film. For example, the high-k dielectric film 414 may have a dielectric constant in a range of about 10 to about 25. The high-k dielectric film 414 may include a material selected from zirconium oxide, zirconium silicon oxide, hafnium oxide, hafnium oxynitride, hafnium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and combinations thereof, without being limited thereto.

The high-k dielectric film 414 may be formed by an ALD process. To form the high-k dielectric film 414, a method of forming a thin film according to an example embodiment of the present inventive concepts may be used, such as, e.g., those described with reference to FIGS. 1, 2A-2C, and 3.

In some example embodiments, the first metal-containing layer 426A may include Ti nitride, Ta nitride, Ti oxynitride, or Ta oxynitride. For example, the first metal-containing layer 426A may include TiN, TaN, TiAlN, TaAlN, TiSiN, or combinations thereof. The first metal-containing layer 426A may be formed through various deposition methods such as ALD, CVD, PVD, and the like.

In some example embodiments, the second metal-containing layer 426B may include an N-type metal-containing layer needed for an NMOS transistor including a Ti or Ta-containing Al compound. For example, the second metal-containing layer 426B may include TiAlC, TiAlN, TiAlCN, TiAl, TaAlC, TaAlN, TaAlCN, TaAl, or combinations thereof.

In some other example embodiments, the second metal-containing layer 426B may include a P-type metal-containing layer needed for a PMOS transistor. For example, the second metal-containing layer 426B may include at least one of Mo, Pd, Ru, Pt, TiN, WN, TaN, Ir, TaC, RuN, and MoN.

The second metal-containing layer 426B may include a single layer or multiple layers.

The second metal-containing layer 426B may serve to adjust a work function of the gate structure 420 in conjunction with the first metal-containing layer 426A. A threshold voltage of the gate structure 420 may be adjusted by work function adjustment of the first metal-containing layer 426A and the second metal-containing layer 426B. In some example embodiments, the first metal-containing layer 426A and/or the second metal-containing layer 426B may be omitted.

The gap-fill metal layer 428 may be formed to fill a remaining gate space on the second metal-containing layer 426B when the gate structure 420 is formed by a replacement metal gate (RMG) process. If the remaining gate space on the second metal-containing layer 426B is not present after the second metal-containing layer 426B is formed, the gap-fill metal layer 428 may be omitted instead of being formed on the second metal-containing layer 426B.

The gap-fill metal layer 428 may include a material selected from the group consisting of W, metal nitrides such as TiN and TaN, Al, metal carbides, metal silicides, metal aluminum carbides, metal silicon nitrides, and the like.

According to the method of fabricating the integrated circuit device 400 in accordance with example embodiments of the present inventive concept, which is described with reference to FIGS. 9A to 9C, the high-k dielectric film 414 may be formed using a method of forming a thin film in accordance with an example embodiment of the present inventive concepts. For example, a precursor adsorption layer including central atoms and organic ligands bonded to the central atoms is formed on the fin-type active region FA on which the interface layer 412 is formed, followed by substituting at least a portion of the organic ligands with a substituent using a non-oxidant, thereby forming an intermediate result layer. Next, an oxidant is supplied to the intermediate result layer, thereby forming an oxide film including the central atoms.

According to the method of fabricating the integrated circuit device 400, which is described with reference to FIGS. 9A to 9C, in forming the high-k dielectric film 414 constituting a 3-dimensional structured transistor, a non-oxidant (for substituting at least a portion of the ligands present in a precursor adsorption layer with a substituent) is introduced as a reaction gas. As such, the non-oxidant is introduced as the reaction gas, thereby effectively removing at least a portion of the ligands without the use of an excess of an oxidant. In addition, since an amount of the oxidant consumed to remove the ligands may be reduced, the oxidant remaining after the oxidant is used to remove the ligands and may contribute to reducing an oxygen vacancy in the high-k dielectric film 414. Therefore, quality and/or properties of the high-k dielectric film 414 constituting the capacitor may be improved.

Although the method of fabricating an integrated circuit device 400 including a FinFET having a 3-dimensional structured channel has been described with reference to FIGS. 9A to 9C, the present inventive concepts are not limited thereto. For example, it will be understood by those skilled in the art that methods of fabricating integrated circuit devices including a planar MOSFET having features according to the present inventive concepts can be provided through various changes and/or modifications of the present inventive concepts without departing from the spirit and scope of the present inventive concepts as described above.

Figure 10:
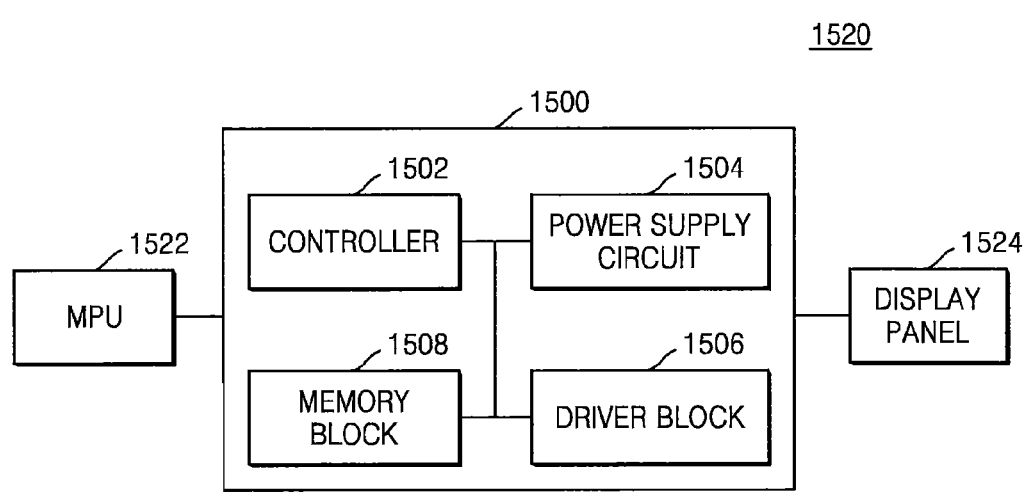
FIG. 10 is a schematic block diagram of a display including a display driver integrated circuit (DDI) according to an example embodiment of the present inventive concepts.

FIG. 10 is a schematic block diagram of a display 1520 including a display driver integrated circuit (DDI) 1500 according to example embodiments of the present inventive concepts.

Referring to FIG. 10, the DDI 1500 may include a controller 1502, a power supply circuit 1504, a driver block 1506, and a memory block 1508. The controller 1502 decodes a command received from a main processing unit (MPU) 1522, and controls each of the blocks of DDI 1500 in order to realize operations according to the command. The power supply circuit 1504 generates a driving voltage in response to control of the controller 1502. The driver block 1506 drives a display panel 1524 using the driving voltage generated from the power supply circuit 1504 in response to control of the controller 1502. The display panel 1524 may be a liquid crystal display panel, a plasma display panel, or an organic light emitting diode (OLED) display panel. The memory block 1508 is a block temporarily storing commands that are input to the controller 1502 or control signals that are output from the controller 1502 or storing needed data, and may include a memory such as RAM, ROM, and the like. At least one of the power supply circuit 1504 and the driver block 1506 includes a thin film formed by the method of forming a thin film according to an example embodiment of the present inventive concepts described with reference to FIGS. 1, 2A-2C, and 3, or the integrated circuit device 300, 400 fabricated by the method described with reference to FIGS. 8A to 9C.

Figure 11:
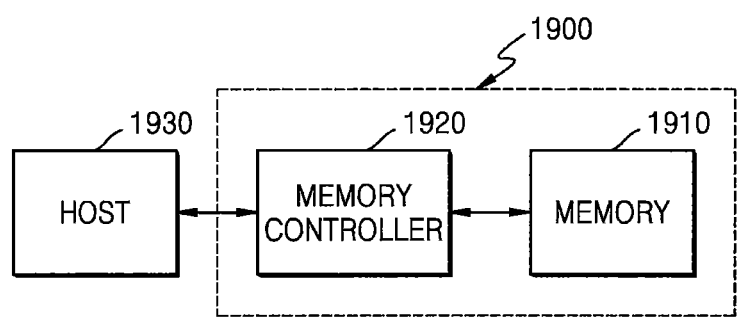
FIG. 11 is a block diagram showing an electronic system according to an example embodiment of the present inventive concepts.

FIG. 11 is a block diagram showing an electronic system 1900 according to example embodiments of the present inventive concepts.

The electronic system 1900 includes a memory 1910 and a memory controller 1920. The memory controller 1920 controls the memory 1910 in order to read data from the memory 1910 and/or write data to the memory 1910 in response to a request of a host 1930. At least one of the memory 1910 and the memory controller 1920 includes a thin film formed by a method of forming a thin film according to the present inventive concepts such as, e.g., those described with reference to FIGS. 1, 2A-2C, and 3, or the integrated circuit device 300, 400 fabricated by the method described with reference to FIGS. 8A to 9C.

Figure 12:
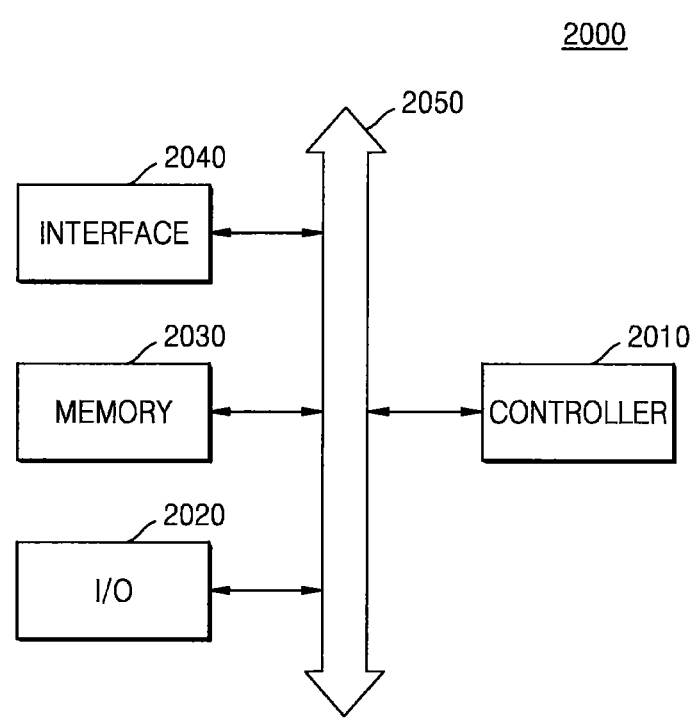
FIG. 12 is a block diagram of an electronic system according to an example embodiment of the present inventive concepts.

FIG. 12 is a block diagram of an electronic system 2000 according to example embodiments of the present inventive concepts.

The electronic system 2000 includes a controller 2010, an input/output (I/O) device 2020, a memory 2030, and an interface 2040, and these components are connected to one another through a bus 2050.

The controller 2010 may include at least one of a microprocessor, digital signal processor, and processing device similar thereto. The input/output device 2020 may include at least one of a keypad, keyboard, and display. The memory 2030 may be used to store commands executed by the controller 2010. For example, the memory 2030 may be used to store user data.

The electronic system 2000 may constitute a wireless communication device or a device capable of transmitting and/or receiving information in a wireless environment. In the electronic system 2000, to transmit and/or receive data through a wireless communication network, the interface 2040 may include a wireless interface. The interface 2040 may include an antenna and/or a wireless transceiver. In some example embodiments, the electronic system 2000 may be used for a communication interface protocol of a third generation communication system, such as code division multiple access (CDMA), global system for mobile communications (GSM), North American digital cellular (NADC), extended-time division multiple access (E-TDMA), and/or wide band code division multiple access (WCDMA) systems. The electronic system 2000 includes a thin film formed by a method of forming a thin film according to the present inventive concepts such as, e.g., those described with reference to FIGS. 1, 2A-2C, and 3, or the integrated circuit device 300, 400 fabricated by the method described with reference to FIGS. 8A to 9C.

While the inventive concept has been particularly shown and described with reference to example embodiments thereof, it will be understood that various changes in form and details may be made therein without departing from the spirit and scope of the following claims.

What is claimed is:

1. A method of forming a thin film, comprising:
    forming a precursor adsorption layer comprising an organic ligand by supplying a precursor onto a lower structure, wherein the precursor comprises the organic ligand and a metal or silicon central atom;
    forming an intermediate result layer by supplying a non-oxidant onto the precursor adsorption layer, wherein the organic ligand of the precursor adsorption layer is substituted with a substituent; and forming an oxide film comprising the central atom from the precursor adsorption layer by supplying an oxidant onto the intermediate result layer, wherein the non-oxidant comprises a nitrogen-containing material, and the substituent is amidogen (—NH$_2$).

2. The method of claim 1, wherein the precursor comprises an amido ligand.

3. The method of claim 1, wherein the precursor comprises a first ligand comprising an amido ligand, and at least one second ligand selected from a C1 to C5 aliphatic organic ligand and a C4 to C20 aromatic organic ligand.

4. The method of claim 1, wherein the precursor is represented by the following formula:

$$M(NR^1R^2)_m R^3_n,$$

wherein M is the central atom;

N is a nitrogen atom;

R$^1$ and R$^2$ are each independently a C1 to C5 alkyl group;

R$^3$ is one selected from NR$^1$R$^2$, a C1 to C5 aliphatic organic ligand, and a substituted or unsubstituted C4 to C20 aromatic organic ligand;

m and n are each independently an integer of 0 or more; and m+n is an integer of 2 to 8.

5. The method of claim 1, wherein the non-oxidant is devoid of an oxygen atom.

6. A method of fabricating an integrated circuit device, comprising:

forming a lower structure having a step height on a substrate; and forming an oxide film on the lower structure, wherein the forming of the oxide film comprises:

forming a precursor adsorption layer on an upper surface and sidewalls of the lower structure, the precursor adsorption layer comprising metal or silicon central atoms and organic ligands bonded to the central atoms;

substituting at least a portion of the organic ligands with a substituent by supplying a non-oxidant onto the precursor adsorption layer; and forming the oxide film that comprises the central atoms by supplying an oxidant onto the precursor adsorption layer comprising the substituent, thereby forming the oxide film, wherein in the step of forming the precursor adsorption layer, the organic ligands comprise an amido ligand, and in the step of substituting at least the portion of the organic ligands with the substituent, the non-oxidant is a nitrogen-containing material.

7. The method of claim 6, wherein forming the precursor adsorption layer further comprises supplying a precursor onto the lower structure, where the precursor is represented by the following formula:

$$M(NR^1R^2)_m R^3_n,$$

wherein M is the central atom;

N is a nitrogen atom;

R$^1$ and R$^2$ are each independently a C1 to C5 alkyl group;

R$^3$ is one selected from NR$^1$R$^2$, a C1 to C5 aliphatic organic ligand, and a substituted or unsubstituted C4 to C20 aromatic organic ligand;

m and n are each independently an integer of 0 or more; and m+n is an integer of 2 to 8.

8. The method of claim 6, wherein in the step of substituting at least the portion of the organic ligands with the substituent, the non-oxidant is NH$_3$, NH$_2$A$^1$, or NHA$^1$A$^2$, wherein A$^1$ and A$^2$ are the same or different and are each independently a C1 to C5 linear or branched alkyl group or a substituted or unsubstituted C4 to C20 aromatic group.

9. The method of claim 6, wherein the step of forming the lower structure comprises:

forming a mold pattern on the substrate, the mold pattern comprising a hole exposing a conductive region of the substrate;

forming an electrode having a sidewall extending along an inner wall of the hole; and exposing the sidewall of the electrode by removing the mold pattern to provide an exposed surface comprising the sidewall of the electrode, and the step of forming the oxide film comprises forming a ZrO$_2$ film covering the exposed surface.

10. The method of claim 6, wherein the step of forming the lower structure comprises forming a fin-type active region protruding upwards from the substrate by partially etching the substrate, and the step of forming the oxide film comprises forming a ZrO$_2$ film covering the fin-type active region.

11. The method of claim 6, wherein the non-oxidant is devoid of an oxygen atom.

12. A method of forming a thin film, comprising:

supplying a precursor onto a lower structure to form a precursor adsorption layer, wherein the precursor comprises a metal or silicon central atom and an organic ligand;

supplying a non-oxidant onto the precursor adsorption layer to form an intermediate result layer, wherein supplying the non-oxidant onto the precursor adsorption layer comprises substituting the organic ligand of the precursor adsorption layer with a substituent; and supplying an oxidant onto the intermediate result layer to form the thin film, the thin film comprising the metal or silicon central atom from the precursor adsorption layer, wherein the non-oxidant comprises a nitrogen-containing material, and the substituent is amidogen (—NH$_2$).

13. The method of claim 12, wherein the precursor comprises an amido ligand.

14. The method of claim 12, wherein the precursor is (cyclopentadienyl)tris(dimethylamino)zirconium and the non-oxidant is NH$_3$.

15. The method of claim 12, wherein the oxidant comprises O$_3$, H$_2$O, O$_2$, NO$_2$, NO, N$_2$O, H$_2$O, alcohol, a metal alkoxide, plasma O$_2$, remote plasma O$_2$, plasma N$_2$O, and/or plasma H$_2$O.

16. The method of claim 12, wherein the precursor comprises zirconium (Zr) and an amido ligand, and the thin film comprises ZrO$_2$.

17. The method of claim 12, wherein the lower structure comprises an electrode layer, and the thin film is a dielectric film on the electrode layer.

18. The method of claim 12, wherein the lower structure comprises a fin-type active region comprising a semiconductor, and the thin film is a dielectric film covering an upper surface and sidewalls of the fin-type active region.

19. The method of claim 12, wherein the non-oxidant is devoid of an oxygen atom.

* * * * *